US012633939B2

(12) United States Patent
Jain et al.

(10) Patent No.: US 12,633,939 B2
(45) Date of Patent: May 19, 2026

(54) METHODS, SYSTEMS, AND APPARATUSES FOR CALIBRATING RESISTOR-CAPACITOR (RC) CIRCUITS

(71) Applicant: STMicroelectronics International N.V., Geneva (CH)

(72) Inventors: Abhishek Jain, Delhi (IN); Anand Kumar, Noida (IN)

(73) Assignee: STMicroelectronics International N.V., Geneva (CH)

( * ) Notice: Subject to any disclaimer, the term of this patent is extended or adjusted under 35 U.S.C. 154(b) by 269 days.

(21) Appl. No.: 18/592,210

(22) Filed: Feb. 29, 2024

(65) Prior Publication Data

US 2024/0364357 A1      Oct. 31, 2024

Related U.S. Application Data

(60) Provisional application No. 63/498,759, filed on Apr. 27, 2023.

(51) Int. Cl.
| | |
|---|---|
| *H03M 3/00* | (2006.01) |
| *H03B 5/24* | (2006.01) |
| *H03M 1/10* | (2006.01) |
| *H03M 1/12* | (2006.01) |

(52) U.S. Cl.
CPC .............. *H03M 3/30* (2013.01); *H03B 5/24* (2013.01); *H03M 1/10* (2013.01); *H03M 1/12* (2013.01)

(58) Field of Classification Search
CPC . H03M 3/30; H03M 1/10; H03M 1/12; H03B 5/24
See application file for complete search history.

(56) References Cited

U.S. PATENT DOCUMENTS

| | | | |
|---|---|---|---|
| 5,594,388 A | 1/1997 | O'Shaughnessy et al. | |
| 6,995,672 B1 | 2/2006 | Yones | |
| 7,132,863 B2 | 11/2006 | Wadhwa et al. | |
| 8,643,518 B2 * | 2/2014 | da Silva ............... | H03M 3/386 |
| | | | 341/120 |
| 9,268,351 B2 | 2/2016 | Rutter et al. | |
| 2007/0080724 A1 | 4/2007 | Wadhwa et al. | |
| 2012/0062326 A1 | 3/2012 | Pancholi et al. | |
| 2017/0353158 A1 | 12/2017 | Hsu | |
| 2020/0395921 A1 | 12/2020 | Roy et al. | |
| 2022/0381815 A1 | 12/2022 | Chen et al. | |

FOREIGN PATENT DOCUMENTS

| | | |
|---|---|---|
| CN | 105790548 A | 7/2016 |
| CN | 114384303 A | 4/2022 |

OTHER PUBLICATIONS

Okilly, et al., "Optimal Design Analysis with Simulation and Experimental Performance Investigation of High-Power Density Telecom PFC Converters," Applied Sciences, 11, No. 17: 7911, (2021).
Abdel-Rahman et al., "PFC Boost Converter Design Guide," Feb. 22, 2016; Infineon Techologies, Revision 1.1.

(Continued)

*Primary Examiner* — Joseph J Lauture

(74) *Attorney, Agent, or Firm* — Alston & Bird LLP

(57)      ABSTRACT

Various examples in accordance with the present disclosure provide example methods, systems, and apparatuses that may calibrate a resistor-capacitor (RC) circuit.

20 Claims, 9 Drawing Sheets

(56) References Cited

OTHER PUBLICATIONS

Wang et al., "A 12.77-MHz 31 ppm/○C On-Chip RC Relaxation Oscillator With Digital Compensation Technique," IEEE Transactions on Circuits and Systems-I: Regular Papers, vol. 63, No. 11. Nov. 2016.

Pavan et al., "Understanding Delta-Sigma Data Converters, Second Edition" IEEE Press Series on Microelectronic Systems, Published by John Wiley & Sons, Inc., Hoboken, New Jersey. Published simultaneously in Canada, ISBN: 978-1-119-25827-8. Copyright 2017.

Chen et al., "A 120-MHz Active-RC Filter with an Agile Frequency Tuning Scheme in 0.18-μm CMOS," IEEE International Symposium on VLSI Design, Automation and Test (VLSI-DAT) (Apr. 2008), 208-211.

* cited by examiner

METHODS, SYSTEMS, AND APPARATUSES FOR CALIBRATING RESISTOR-CAPACITOR (RC) CIRCUITS

CROSS-REFERENCE TO RELATED APPLICATIONS

This application claims priority to and the benefit of U.S. Provisional Patent Application No. 63/498,759, filed Apr. 27, 2023, the entire content of which is incorporated by reference in its entirety.

FIELD OF THE INVENTION

Example embodiments of the present disclosure relate generally to signal processing and, more particularly, to methods, systems and apparatuses that calibrate resistor-capacitor (RC) circuits.

BACKGROUND

Applicant has identified many technical challenges and difficulties associated with circuits.

BRIEF SUMMARY

Various embodiments described herein related to methods, apparatuses, and systems for calibrating RC circuits.

In accordance with various embodiments of the present disclosure, a system for calibrating a RC circuit is provided. In some embodiments, the system comprises an RC adjustment circuit coupled to the RC circuit; an RC relaxation oscillator separated from the RC circuit and generating an oscillation signal that indicates an RC component value associated with the RC circuit; and an RC deviation determination circuit coupled to the RC relaxation oscillator and the RC adjustment circuit. In some embodiments, the RC deviation determination circuit generates an RC adjustment signal for adjusting the RC component value associated with the RC circuit based at least in part on the oscillation signal and a reference clock signal.

In some embodiments, the RC circuit comprises an integrator circuit associated with a Delta-Sigma modulator.

In some embodiments, the RC circuit comprises: an amplifier having an amplifier input terminal and an amplifier output terminal; a resistor coupled to an input voltage source and the amplifier input terminal; and a capacitor coupled to the amplifier input terminal and the amplifier output terminal.

In some embodiments, the RC adjustment circuit comprises a plurality of capacitance adjustment circuit branches that is coupled in parallel to the amplifier input terminal and the amplifier output terminal. In some embodiments, the plurality of capacitance adjustment circuit branches comprises a plurality of branch switches and a plurality of adjustment capacitors.

In some embodiments, each of the plurality of adjustment capacitors is coupled to a corresponding branch switch of the plurality of branch switches. In some embodiments, operational states of the plurality of branch switches are controlled based on the RC adjustment signal.

In some embodiments, the RC adjustment circuit comprises a plurality of resistance adjustment circuit branches that is coupled in parallel to the input voltage source and the amplifier input terminal. In some embodiments, the plurality of resistance adjustment circuit branches comprises a plurality of branch switches and a plurality of adjustment resistors.

In some embodiments, each of the plurality of adjustment resistors is coupled to a corresponding branch switch of the plurality of branch switches. In some embodiments, operational states of the plurality of branch switches are controlled based on the RC adjustment signal.

In some embodiments, the RC relaxation oscillator comprises: a latch comprising a latch output terminal that provides the oscillation signal to the RC deviation determination circuit; a first comparator comprising a first comparator output terminal that is coupled to a first latch input terminal of the latch; and a second comparator comprising a second comparator output terminal that is coupled to a second latch input terminal of the latch.

In some embodiments, a first comparator inverting input terminal of the first comparator and a second comparator inverting input terminal of the second comparator are coupled to a reference voltage source.

In some embodiments, the RC relaxation oscillator further comprises: a first switch selectively coupling a first capacitor of the RC relaxation oscillator to a current generator; and a second switch selectively coupling a second capacitor of the RC relaxation oscillator to the current generator. In some embodiments, the first switch and the second switch are complementary.

In some embodiments, the oscillation signal is associated with an oscillation period. In some embodiments, the oscillation period is based on the RC component value.

In some embodiments, the RC deviation determination circuit comprises: a counter receiving the oscillation signal from the RC relaxation oscillator and the reference clock signal from a reference clock. In some embodiments, the counter generates a clock cycle count associated with the oscillation signal based at least in part on the reference clock signal.

In some embodiments, the RC deviation determination circuit comprises: a decoder receiving the clock cycle count from the counter and outputting the RC adjustment signal to the RC adjustment circuit. In some embodiments, the decoder generates the RC adjustment signal based at least in part on comparing the clock cycle count with a predetermined clock cycle count.

In some embodiments, the predetermined clock cycle count is based on a calibrated RC component value associated with the RC circuit.

In accordance with various embodiments of the present disclosure, a method for calibrating a RC circuit is provided. In some embodiments, the method comprises: receiving an oscillation signal from an RC relaxation oscillator that indicates an RC component value associated with the RC circuit; determining an RC adjustment signal for adjusting the RC component value associated with the RC circuit based at least in part on the oscillation signal and a reference clock signal; and transmitting the RC adjustment signal to an RC adjustment circuit that is coupled to the RC circuit. In some embodiments, the RC relaxation oscillator is separated from the RC circuit.

In some embodiments, the method comprises generating a clock cycle count associated with the oscillation signal based at least in part on the reference clock signal.

In some embodiments, the method comprises generating the RC adjustment signal based at least in part on comparing the clock cycle count with a predetermined clock cycle count.

In accordance with various embodiments of the present disclosure, a Delta-Sigma modulator is provided. In some embodiments, the Delta-Sigma modulator comprises: an integrator circuit; and a RC calibration system coupled to the integrator circuit. In some embodiments, the RC calibration system comprises: an RC adjustment circuit coupled to the integrator circuit; an RC relaxation oscillator separated from the integrator circuit and generating an oscillation signal that indicates an RC component value associated with the integrator circuit; and an RC deviation determination circuit coupled to the RC relaxation oscillator and the RC adjustment circuit. In some embodiments, the RC deviation determination circuit generates an RC adjustment signal for adjusting the RC component value associated with the integrator circuit based at least in part on the oscillation signal and a reference clock signal.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

4

Figure 9:
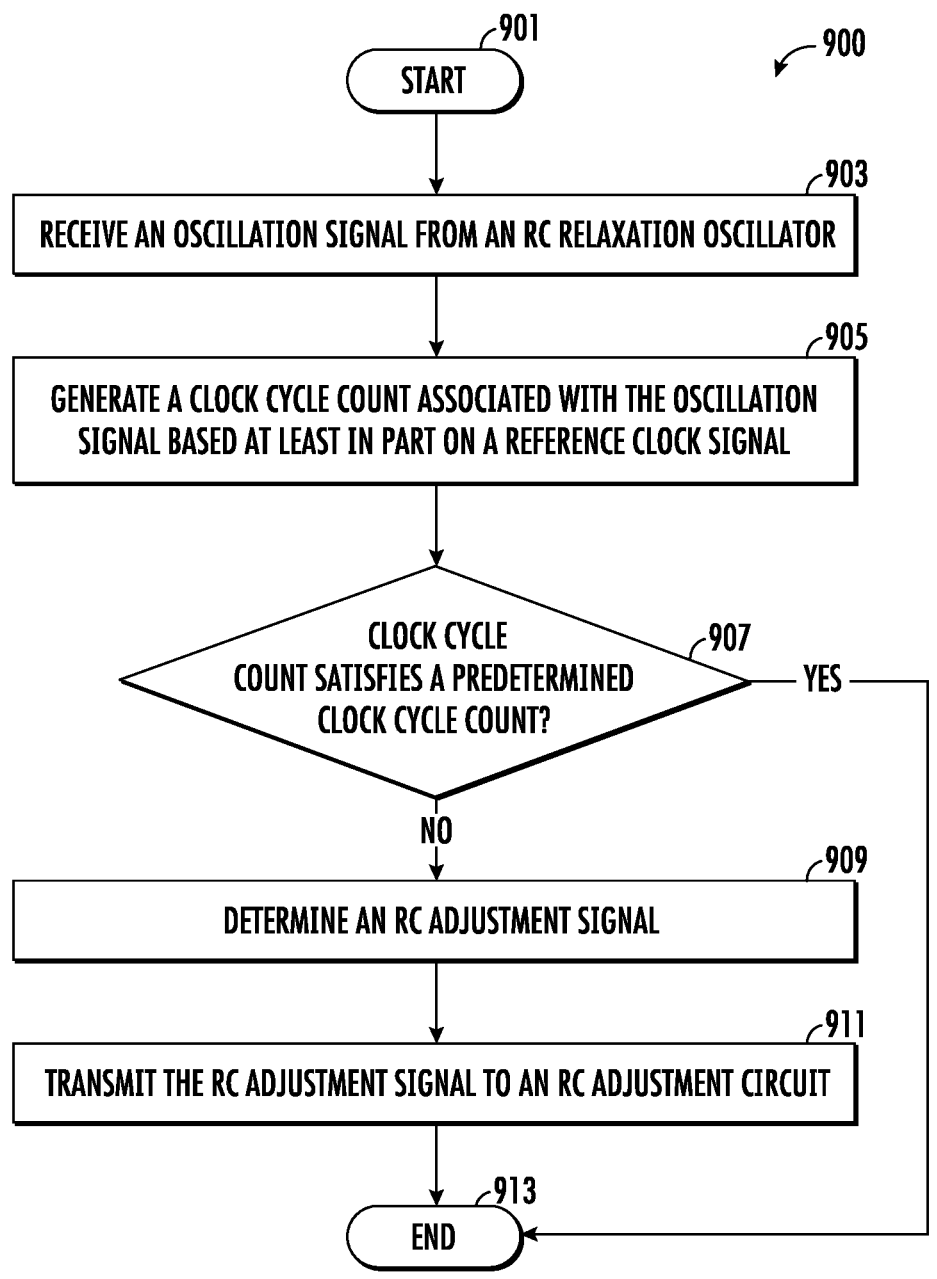
Figure 10:
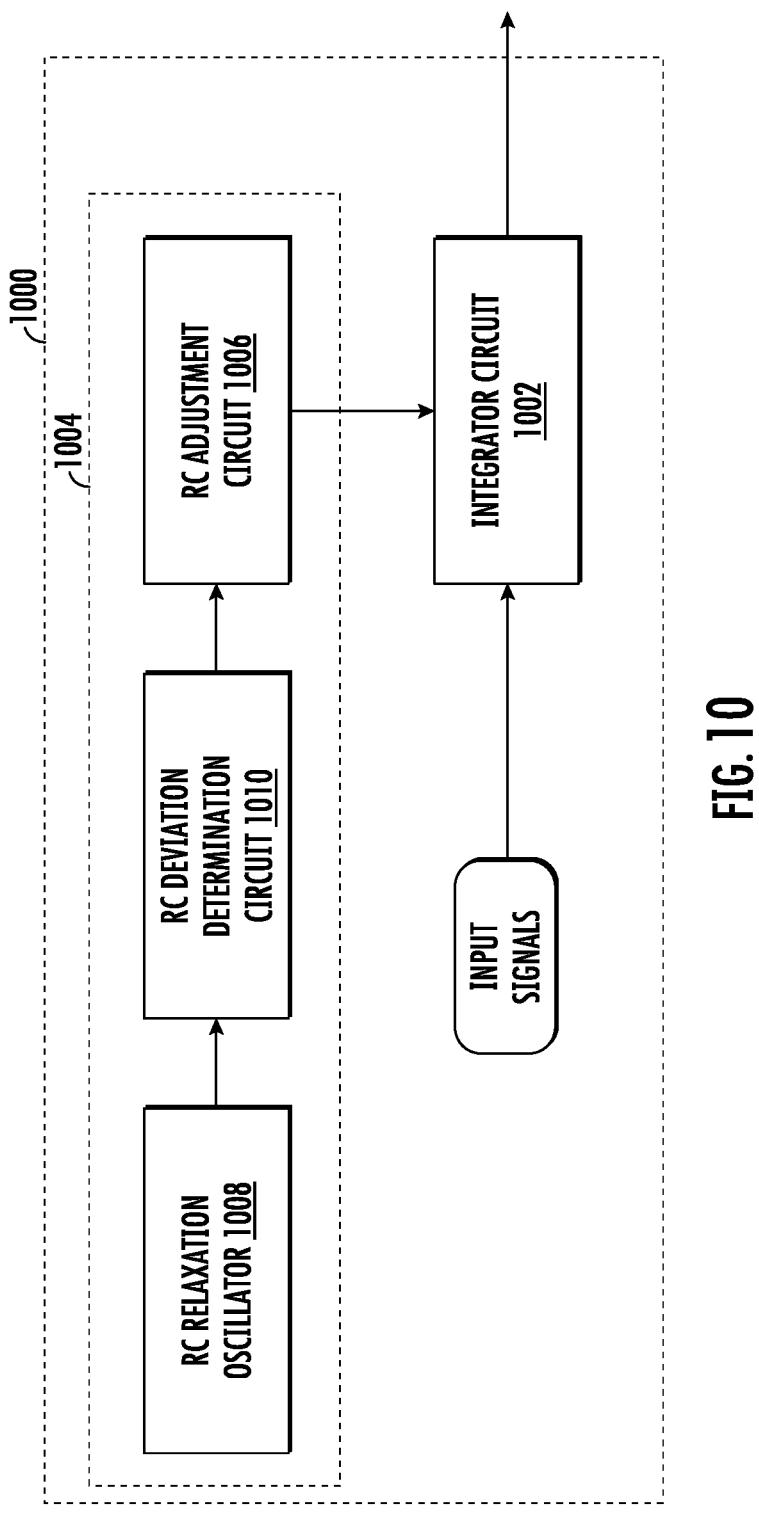

FIG. 9 provides an example flow diagram illustrating an example method for calibrating an example RC circuit in accordance with some embodiments of the present disclosure; and FIG. 10 provides an example block diagram illustrating an example Delta-Sigma modulator in accordance with some embodiments of the present disclosure.

DETAILED DESCRIPTION OF THE INVENTION

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

As described above, there are many technical challenges and difficulties associated with circuits. For example, process, voltage, and temperature (PVT) variations may significantly impact functionality, reliability, and performance of electronic components (such as, but not limited to, resistors and capacitors) in the circuits.

As an example, process variations refer to fluctuations and changes in manufacturing procedures and processes that may cause inconsistencies and deviations in the physical dimensions and/or electronic properties. For example, process variations may be results of factors such as, but not limited to, faulty equipment or fabrication apparatuses, variability in the raw materials, and/or the like. Process variations may cause the manufactured electronic components (such as, but not limited to, resistors, capacitors, and/or the like) to deviate from the intended design specifications, which may in turn cause deterioration of functionality and performance of electronic components (such as, but not limited to, resistors, capacitors, and/or the like) and integrated circuits (ICs) that are fabricated using these electronic components.

As another example, voltage variations refer to fluctuations and changes in the voltage that is supplied to electronic components and ICs. Voltage variations may be results of factors such as, but not limited to, signal noise in the power supply, changes in the load connected to the power supply, electromagnetic interferences, and/or the like. Voltage variations may affect operations and performance of electronic components and ICs, leading to performance issues such as, but not limited to, distorted signals, increased noise, and reduced reliability.

As another example, temperature variations refer to fluctuations and changes in the ambient temperature of the operating environment where electronic components and ICs operate and/or fluctuations and changes in the temperatures of electronic components and ICs. Temperature variations may be caused by factors such as, but not limited to, changes in the operating environment, power dissipation in the electronic system, and/or the like. Temperature variations may affect operations and performance of electronic components and ICs. For example, many resistors may exhibit a positive temperature coefficient such that an increase in temperature causes an increase of resistance of the resistor. As another example, different capacitors may be associated with different temperature coefficients, and changes in temperature may cause changes in capacitance of the capacitors. As another example, high temperature may accelerate the aging of electronic components, resulting in reduced lifespan and deteriorated performance.

Figure 1:
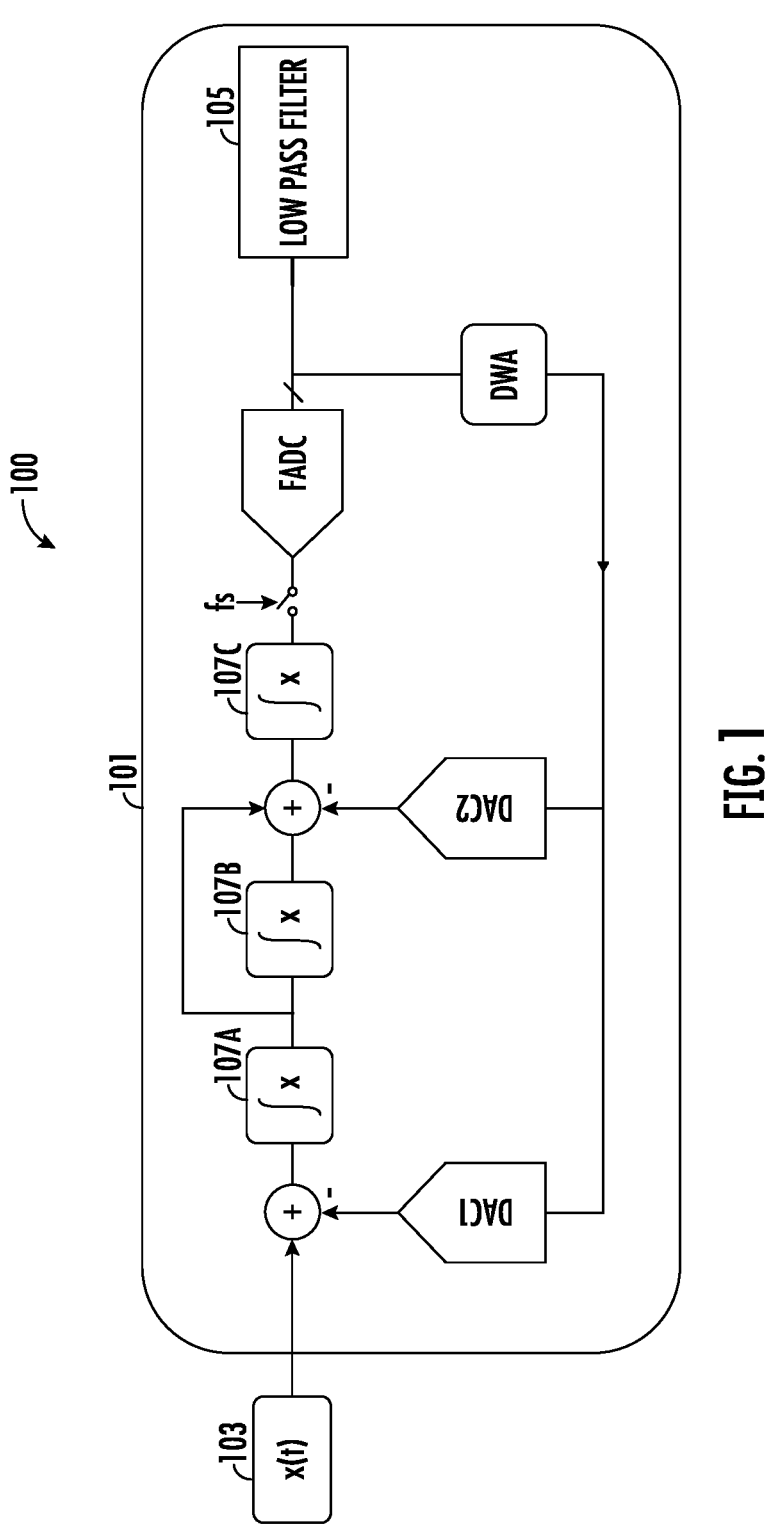
FIG. 1 provides an example signal processing diagram illustrating example components associated with an example signal processing system in the form of an example Delta-Sigma modulator.

PVT variations may cause technical challenges and difficulties during operations of electronic components and ICs. Referring now to FIG. 1, an example diagram illustrating example components associated with an example signal processing system 100 is provided. In the example shown in FIG. 1, the example signal processing system 100 comprises an example analog-to-digital converter (ADC) 101 such as, but not limited to, an example Delta-Sigma modulator. For example, the example ADC 101 may comprise an example loop filter that includes integrator circuits such as, but not limited to, an example integrator circuit 107A, an example integrator circuit 107B, and an example integrator circuit 107C.

In some embodiments, the example loop filter may be designed based on the desired transfer functions associated with the example ADC. In examples where the example ADC comprises an example Delta-Sigma modulator, properties and/or characteristics associated with the example loop filter may define various transfer functions associated with the example Delta-Sigma modulator, which dictate behaviors of the example Delta-Sigma modulator such as, but not limited to, noise shaping, resolution, and/or the like.

In the example shown in FIG. 1, the example ADC 101 may receive an input signal x(t) 103, may perform one or more transfer functions based on the input signal x(t) 103, and provide outputs to a low pass filter 105 (such as, but not limited to, a digital low pass filter, an analogy low pass filter, and/or the like). As an example, the example loop filter of the example ADC 101 may define the following the loop filter transfer function L(s) for the example Delta-Sigma modulator:

$$L(s) = k_0 + \frac{k_1 f_s}{s} + \frac{k_2 f_s^2}{s} + \frac{k_3 f_s^3}{s}$$

In the above example, $k_0$, $k_1$, $k_2$, and $k_3$ refer to constant values, $f_s$ refers to the sample frequency of the example Delta-Sigma modulator, and s refers to the Laplace domain transform function.

In some embodiments, the example loop filter of the example ADC 101 may implement one or more RC circuits (such as, but not limited to, integrator circuits) in order to achieve loop filter transfer function(s). In some embodiments, the term "RC circuit" refers to a type of circuit that comprises a resistor and a capacitor connected in series or in parallel. In some embodiments, the term "integrator circuit" refers to a type of RC circuit that accumulates input signals over time. For example, an example integrator circuit may perform the mathematical operation of integration. Example integrator circuits may include, but not limited to, operational transconductance amplifier RC (OTA-RC) integrator circuits, operational amplifier RC (opamp-RC) integrator circuits, transconductance amplifier and capacitor (Gm-C) integrator circuits, and/or the like.

As described above, the example ADC 101 may comprise integrator circuits such as, but not limited to, an example integrator circuit 107A, an example integrator circuit 107B, and an example integrator circuit 107C. In some embodiments, implementing example integrator circuits in a loop filter of an example Delta-Sigma modulator may provide technical benefits and advantages such as, but not limited to, shaping the noise from the example Delta-Sigma modulator and providing stability to the feedback loop of the example Delta-Sigma modulator.

While the description above provides an example loop filter, it is noted that the scope of the present disclosure is not limited to the description above. Example embodiments of the present disclosure may be implemented in other systems such as, but not limited to, low pass filters, high pass filters, bandpass filters, and/or the like.

Figure 2A:
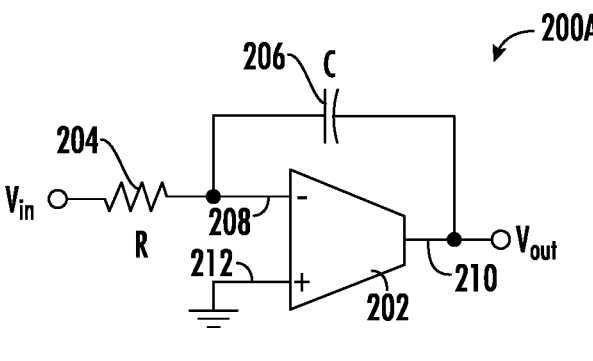
FIG. 2A illustrates an example RC circuit in accordance with some embodiments of the present disclosure.
Figure 2B:
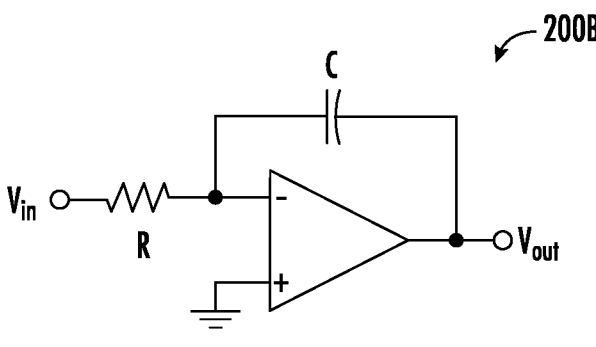
FIG. 2B illustrates an example RC circuit in accordance with some embodiments of the present disclosure.
Figure 2C:
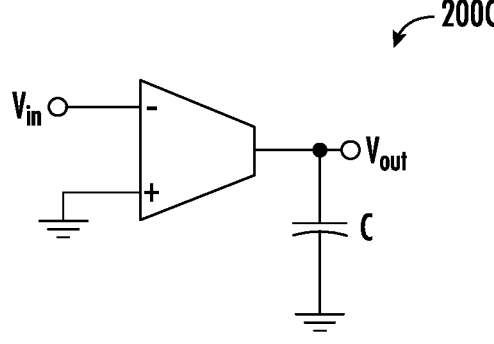
FIG. 2C illustrates an example RC circuit in accordance with some embodiments of the present disclosure.

Referring now to FIG. 2A, FIG. 2B, and FIG. 2C, example RC circuits in accordance with some embodiments of the present disclosure are illustrated.

As described above, example RC circuits may comprise integrator circuits for implementations in, such as, but not limited to, example loop filters for example Delta-Sigma modulators in accordance with some embodiments of the present disclosure. For example, the example RC circuits shown in FIG. 2A, FIG. 2B, and FIG. 2C comprise integrator circuits associated with example ADCs such as, but not limited to, Delta-Sigma modulators. As an example, the example RC circuit 200A shown in FIG. 2A may comprise an example OTA-RC integrator circuit associated with an example Delta-Sigma modulator, the example RC circuit 200B shown in FIG. 2B may comprise an example opamp-RC integrator circuit associated with an example Delta-Sigma modulator, and the example RC circuit 200C shown in FIG. 2C may comprise an example Gm-C integrator circuit associated with an example Delta-Sigma modulator.

In some embodiments, an example RC circuit comprises various electronic components that are coupled to one another. For example, the example RC circuit 200A illustrated in FIG. 2A comprises an amplifier 202, a resistor 204, and a capacitor 206.

In some embodiments, an example amplifier refers to an electronic component that increases the amplitude or strength of an input signal without altering its original shape or characteristics. In accordance with various examples of the present disclosure, an example amplifier may comprise voltage amplifiers, current amplifiers, power amplifiers, operational amplifiers, and/or the like.

In the example shown in FIG. 2A, the amplifier 202 comprises an amplifier inverting input terminal 208, an amplifier non-inverting input terminal 212, and an amplifier output terminal 210. In some embodiments, the resistor 204 is coupled to an input voltage source $V_{in}$ and the amplifier inverting input terminal 208. For example, electric power from the input voltage source $V_{in}$ may flow through the resistor 204 and then to the amplifier inverting input terminal 208 of the amplifier 202. In some embodiments, the capacitor 206 is coupled to the amplifier inverting input terminal 208 and the amplifier output terminal 210. For example, the capacitor 206 may discharge electric power to the amplifier inverting input terminal 208 and the amplifier output terminal 210 of the amplifier 202. In some embodiments, the amplifier non-inverting input terminal 212 of the amplifier 202 is connected to the ground.

In some embodiments, the amplifier 202 may comprise an operational transconductance amplifier ("OTA"). In such embodiments, the example RC circuit 200A may also be referred to as an OTA-RC integrator circuit. For example, the amplifier 202 may convert input voltage from the input voltage source $V_{in}$ to an output current, and the resistor 204 and the capacitor 206 may define characteristics associated with the OTA-RC integrator circuit.

Continuing from the example above, an input voltage $V_{in}$ from the input voltage source is applied to the amplifier inverting input terminal 208 of the amplifier 202. The amplifier 202 may convert an input voltage difference between the amplifier inverting input terminal 208 and the amplifier non-inverting input terminal 212 to an output current. As illustrated in FIG. 2A, the capacitor 206 is coupled parallel to the amplifier 202 and between the amplifier inverting input terminal 208 and the amplifier output terminal 210. As such, the output current from the amplifier 202 may be fed into the capacitor 206 to charge the capacitor 206 and cause the voltage across the capacitor 206 to change over time.

In the example shown in FIG. 2A, the output voltage Vout from the example RC circuit 200A may be calculated based on input voltage $V_{in}$ according to the following example equation:

$$V_{out}(s) = -\frac{1}{sRC} V_{in}(s)$$

In the above example equation, s refers to the Laplace domain transform function, R refers to the resistance value of the resistor 204, and C refers to the capacitance value of the capacitor 206. As such, an example transfer function implemented by the example RC circuit 200A may be represented in the following example equation:

$$\frac{V_{out}(s)}{V_{in}(s)} = -\frac{1}{sRC}$$

As illustrated in the example equation above, the example transfer function of the example RC circuit 200A is defined by on the RC component value of the example RC circuit 200A. In the present disclosure, the terms "RC component value" or "RC product value" refer to the resistance value of the resistor multiplied by the capacitance value of the capacitor in an RC circuit. For example, the RC component value associated with the example RC circuit 200A may be calculated based on the resistance value of the resistor 204 multiplied by the capacitance value of the capacitor 206.

In some embodiments, an example RC component value is also referred to as a RC time constant. In such embodiments, the RC time constant measures the time that it takes for the voltage across a capacitor of an RC circuit to charge or discharge to approximately 63.2% of its final value in response to a step change in the voltage. For example, the example RC component value associated with the example RC circuit 200A may indicate the time that it takes for the voltage across the capacitor 206 to charge or discharge to approximately 63.2% of its final value in response to a step change in the voltage.

As described above, the example RC circuit 200A may be implemented for a loop filter function in an example Delta-Sigma modulator. In such examples, a stable Delta-Sigma modulator requires a stable loop filter function, which in turns requires a stable transform function defined by the example RC circuit 200A. In such an example, the RC component should remain constant so that the example RC circuit 200A may support a stable loop filter function for implementations in ADCs such as, but not limited to, Delta-Sigma modulators. However, PVT variations described above may cause the resistance value of the resistor 204 and/or the capacitance value of the capacitor 206 to vary and deviate from their specification values. As a result, a loop filter transfer function of a loop filter that is implemented based on the example RC circuit 200A may fluctuate and change, leading to instability of ADCs (such as, but not limited to, Delta-Sigma modulators).

While the description above illustrates example technical problems associated with the transfer function of a loop filter, it is noted that the scope of the present disclosure is not limited to addressing technical problems associated with loop filters.

Various embodiments of the present disclosure overcome the above technical challenges and difficulties and provide various technical improvements and advantages based on, for example, but not limited to, providing example methods, devices, and systems that may trim the resistance value of a resistor in a RC circuit and/or the capacitance value of the capacitor in the RC circuit in such a way that the RC component value of the RC circuit remains constant.

For example, examples of the present disclosure provide robust methodologies to detect the RC component value of an RC circuit. Some example methods of the present disclosure may use an example RC relaxation oscillator in conjunction with a counter to accurately determine a RC process corner associated with the RC circuit that accounts for affected performance of the RC circuit due to factor such as, but not limited to, PVT variations. In the present disclosure, the term "RC process corner" refers to variations and deviations in the resistance and capacitance values of components within the RC circuit due to fabrication variations such as, but not limited to, PVT variations.

In some embodiments, after the RC corner is determined, some example methods of the present disclosure may use a digital logic (such as, but no limited to, a decoder) to generate RC adjustment signals (for example, but not limited to, RC trim codes) such that the RC component value of the RC circuit is close to its nominal value or a calibrated value. For example, various example methods of the present disclosure may determine a code (for example, but not limited to, a clock cycle count) that corresponds to the drift in the RC component value, compare it with the typical value for the RC component value, and use it to trim the RC component value of a RC circuit (such as, but not limited to, integrator circuits).

As such, various examples of the present disclosure may provide technical solutions for calibrating the RC component value of an RC circuit and fine-tuning the cutoff frequency of filters (such as, but not limited to, low pass filters, high pass filters, bandpass filters, and/or the like). Various examples of the present disclosure may provide a low frequency back-up clock for a system that is associated with the RC circuit. Various embodiments of the present disclosure may be implemented for circuit calibrations such as, but not limited to, RC calibration, Sigma Delta calibration, and/or the like.

While the description above provides example integrator circuits, it is noted that the scope of the present disclosure is not limited to the description above. In some examples, an example RC may additionally or alternatively comprise one or more other types of integrator circuits, and may additionally or alternatively comprise one or more circuits other than integrator circuits.

Figure 3:
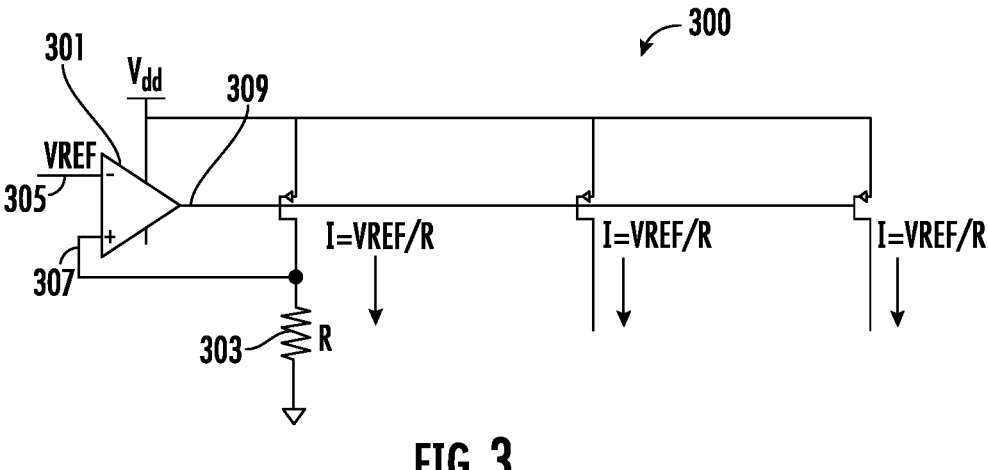
FIG. 3 illustrates an example current generator in accordance with some embodiments of the present disclosure.

Referring now to FIG. 3, an example current generator 300 in accordance with some embodiments of the present disclosure is illustrated.

In some embodiments, the example current generator 300 may be external to an example RC calibration system of such embodiments of the present disclosure. For example, the example current generator 300 may provide an input current I to the example RC calibration system (for example, to an example RC relaxation oscillator of the example RC calibration system).

In some embodiments, the example current generator 300 may be internal an example RC calibration system of such embodiments of the present disclosure. For example, the example current generator 300 may provide the input current I to an example RC relaxation oscillator of the example RC calibration system, details of which are described herein.

In the example shown in FIG. 3, the example current generator 300 comprises an amplifier 301 and a resistor 303. In some embodiments, the amplifier 301 comprises an amplifier inverting input terminal 305, an amplifier non-inverting input terminal 307, and an amplifier output terminal 309. In some embodiments, a reference voltage $V_{REF}$ from a voltage source is supplied to the amplifier inverting input terminal 305. In some embodiments, a first end of the resistor 303 is coupled to both the amplifier non-inverting input terminal 307 and the amplifier output terminal 309, and a second end of the resistor is coupled to an example RC relaxation oscillator of the example RC calibration system to provide the input current I. In such embodiments, the input current I may be calculated based on the following example equation:

$$I = \frac{V_{REF}}{R}$$

In the above example equation, $V_{REF}$ refers to the reference voltage that is supplied to the amplifier 301, and R refers to the resistance value of the resistor 303.

While the description above provides an example current generator for generating an input current, it is noted that the scope of the present disclosure is not limited to the description above. In some examples, an example current generator may comprise one or more additional and/or alternative circuits for generating the input current.

Figure 4:
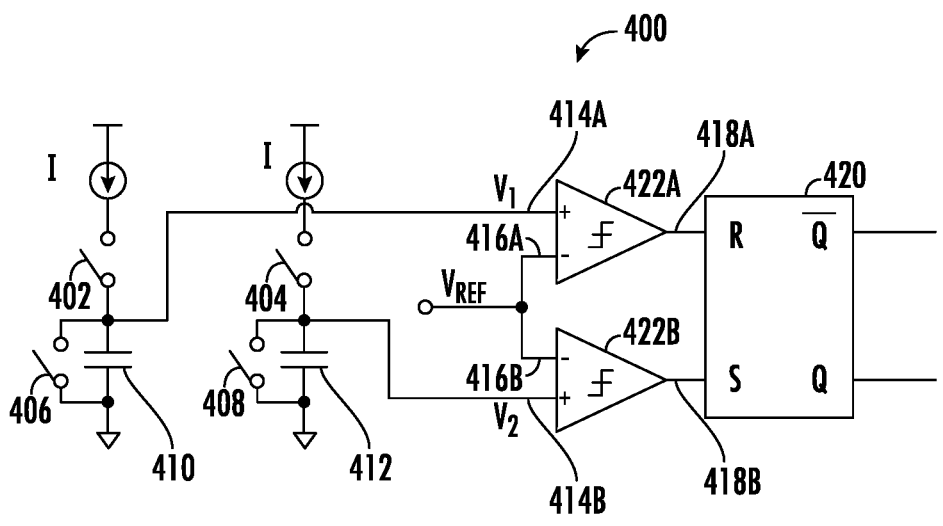
FIG. 4 illustrates an example RC relaxation oscillator in accordance with some embodiments of the present disclosure.

As described above, the example current generator 300 may provide the input current I to an example RC relaxation oscillator of an example RC calibration system in some embodiments of the present disclosure. Referring now to FIG. 4, an example RC relaxation oscillator 400 in accordance with some embodiments of the present disclosure is illustrated.

In some embodiments, the example RC relaxation oscillator 400 comprises at least one comparator, at least one capacitor, at least one latch, and one or more switches. In the example shown in FIG. 4, the example RC relaxation oscillator 400 comprises a first comparator 422A, a second comparator 422B, a latch 420, a first capacitor 410, a second capacitor 412, and a plurality of switches (such as, but not limited to, a first switch 402, a second switch 404, a third switch 406, and a fourth switch 408).

In some embodiments, a first end of the first switch 402 is coupled to an example current generator (such as, but not limited to, the example current generator 300 described above in connection with FIG. 3) and receives the input current I from the example current generator. In some embodiments, a second end of the first switch 402 is coupled to a first end of the first capacitor 410. As such, the first switch 402 selectively couples the first capacitor 410 of the RC relaxation oscillator 400 to a current generator. For example, when the first switch 402 is in a closed state (for example, when the first switch 402 is switched on), the first capacitor 410 is charged by the current generator. When the first switch 402 is in an open state (for example, when the first switch 402 is switched off), the first capacitor 410 is not charged by the current generator.

In some embodiments, the third switch 406 is coupled in parallel with the first capacitor 410. For example, a first end of the third switch 406 is coupled to the first end of the first capacitor 410, and a second end of the third switch 406 is coupled to a second end of the first capacitor 410. As such, the third switch 406 selectively discharges the first capacitor 410 of the RC relaxation oscillator 400. For example, when the third switch 406 is in a closed state (for example, when the third switch 406 is switched on), the first capacitor 410 discharges. When the third switch 406 is in an open state (for example, when the third switch 406 is switched off), the first capacitor 410 does not discharge.

In some embodiments, a first end of the second switch 404 is coupled to an example current generator (such as, but not limited to, the example current generator 300 described above in connection with FIG. 3) and receives the input current I from the example current generator. In some embodiments, a second end of the second switch 404 is coupled to a first end of the second capacitor 412. As such, the second switch 404 selectively couples the second capacitor 412 of the RC relaxation oscillator 400 to a current generator. For example, when the second switch 404 is in a closed state (for example, when the second switch 404 is switched on), the second capacitor 412 is charged by the current generator. When the second switch 404 is in an open state (for example, when the second switch 404 is switched off), the second capacitor 412 is not charged by the current generator.

In some embodiments, the fourth switch 408 is coupled in parallel with the second capacitor 412. For example, a first end of the fourth switch 408 is coupled to the first end of the second capacitor 412, and a second end of the fourth switch 408 is coupled to a second end of the second capacitor 412. As such, the fourth switch 408 selectively discharges the second capacitor 412 of the RC relaxation oscillator 400. For example, when the fourth switch 408 is in a closed state (for example, when the fourth switch 408 is switched on), the second capacitor 412 discharges. When the fourth switch 408 is in an open state (for example, when fourth switch 408 is switched off), the second capacitor 412 does not discharge.

In some embodiments, the first switch 402 and the fourth switch 408 are in the same state at any given time point during operation. For example, when the first switch 402 is in an open state, the fourth switch 408 is in the open state. When the first switch 402 is in a closed state, the fourth switch 408 is in the closed state as well.

In some embodiments, the second switch 404 and the third switch 406 are in the same state at any given time point during operation. For example, when the second switch 404 is in an open state, the third switch 406 is in the open state as well. When the second switch 404 is in a closed state, the third switch 406 is in the closed state as well.

In some embodiments, the first switch 402 and the fourth switch 408 are complementary to the second switch 404 and the third switch 406. In the present disclosure, the term "complementary switches" refers to electronic switches that operate in a coordinated, mutually exclusive manner. For example, when the first switch 402 and the fourth switch 408 are in the open state, the second switch 404 and the third switch 406 are in the closed state. When the first switch 402 and the fourth switch 408 are in the closed state, the second switch 404 and the third switch 406 are in the open state.

In some embodiments, the operational states of the first switch 402, the second switch 404, the third switch 406 and the fourth switch 408 at any given time point during operation may be one of the following two possibilities: (1) the first switch 402 and the fourth switch 408 are in the open state, while the second switch 404 and the third switch 406 are in the closed state; or (2) the first switch 402 and the fourth switch 408 are in the closed state, while the second switch 404 and the third switch 406 are in the open state. In some embodiments, the operational states of the first switch 402, the second switch 404, the third switch 406 and the fourth switch 408 may be controlled based on output signals from output terminals of a latch, details of which are described herein.

As described above, a first switch 402 selectively couples the first capacitor 410 to a current generator so that the input current I is selectively applied to charge the first capacitor 410 and increase the voltage across the first capacitor 410. In some embodiments, the second switch 404 selectively couples the second capacitor 412 to a current generator so that the input current I is selectively applied to charge the second capacitor 412 and increase the voltage across the second capacitor 412.

For example, when the first switch 402 and the fourth switch 408 are in the closed state, the second switch 404 and the third switch 406 are in the open state. In such an example, the closed state of the first switch 402 and the open state of the third switch 406 allow the input current I from the example current generator to charge the first capacitor 410. Continuing in this example, the closed state of the fourth switch 408 and the open state of the second switch 404 allow the second capacitor 412 to discharge.

As another example, when the first switch 402 and fourth switch 408 are in the open state, the second switch

404 and the third switch 406 are in the closed state. In such an example, the closed state of the second switch 404 and the open state of the fourth switch 408 allow the input current I from the example current generator to charge the second capacitor 412. Continuing in this example, the closed state of the third switch 406 and the open state of the first switch 402 allow the first capacitor 410 to discharge.

In some embodiments, each of the first comparator 422A and the second comparator 422B comprises an inverting input terminal, a non-inverting input terminal, and a comparator output terminal. In the example shown in FIG. 4, the first comparator 422A comprises a first comparator inverting input terminal 416A, a first comparator non-inverting input terminal 414A, and a first comparator output terminal 418A. The second comparator 422B comprises a second comparator inverting input terminal 416B, a second comparator non-inverting input terminal 414B, and a second comparator output terminal 418B.

In some embodiments, the first comparator inverting input terminal 416A of the first comparator 422A and the second comparator inverting input terminal 416B of the second comparator 422B are coupled to a reference voltage source and receive a reference voltage $V_{REF}$. In some embodiments, the reference voltage $V_{REF}$ provided to the first comparator inverting input terminal 416A of the first comparator 422A and the second comparator inverting input terminal 416B of the second comparator 422B is the same as the reference voltage $V_{REF}$ provided to the example current generator 300 described above in connection with FIG. 3.

In some embodiments, the first comparator non-inverting input terminal 414A of the first comparator 422A is coupled to the first end of the first capacitor 410. In such embodiments, when the first capacitor 410 is charged by the current generator, the voltage across the first capacitor 410 increases, which causes the voltage $V_1$ received at the first comparator non-inverting input terminal 414A to increase. In some embodiments, the first comparator 422A compares the voltage $V_1$ received at the first comparator non-inverting input terminal 414A with the reference voltage $V_{REF}$ received at the first comparator inverting input terminal 416A, and generates an output signal through the first comparator output terminal 418A. For example, if the voltage $V_1$ is greater than the reference voltage $V_{REF}$, the first comparator 422A generates an output signal indicating a high state (for example, a positive supply voltage or a "1" signal) through the first comparator output terminal 418A. If the voltage $V_1$ is less than the reference voltage $V_{REF}$, the first comparator 422A generates an output signal indicating a low state through the first comparator output terminal 418A (for example, a negative supply voltage or a "0" signal).

In some embodiments, the second comparator non-inverting input terminal 414B of the second comparator 422B is coupled to the first end of the second capacitor 412. In such embodiments, when the second capacitor 412 is charged by the current generator, the voltage across the second capacitor 412 increases, which causes the voltage $V_2$ received at the second comparator non-inverting input terminal 414B to increase. In some embodiments, the second comparator 422B compares the voltage $V_2$ received at the second comparator non-inverting input terminal 414B with the reference voltage $V_{REF}$ received at the second comparator inverting input terminal 416B, and generates an output signal through the second comparator output terminal 418B. For example, if the voltage $V_2$ is greater than the reference voltage $V_{REF}$, the second comparator 422B generates an output signal indicating a high state (for example, a positive supply voltage or a "1" signal) through the second comparator output terminal 418B. If the voltage $V_2$ is less than the reference voltage $V_{REF}$, the second comparator 422B generates an output signal indicating a low state through the second comparator output terminal 418B (for example, a negative supply voltage or a "0" signal).

In some embodiments, the first comparator output terminal 418A of the first comparator 422A is coupled to a first latch input terminal of the latch 420. In some embodiments, the second comparator output terminal 418B of the second comparator 422B is coupled to a second latch input terminal of the latch 420.

In some embodiments, the latch 420 may be in the form of a S-R latch. In such embodiments, the latch 420 comprises a set input terminal ("S"), a reset input terminal ("R"), a Q output terminal, and a Q-bar output terminal. In the example shown in FIG. 4, the first comparator output terminal 418A is coupled to the reset input terminal of the latch 420, and the second comparator output terminal 418B is coupled to the set input terminal of the latch 420. In some embodiments, the Q output terminal and the Q-bar output terminal of the latch 420 each provides output signals. In some embodiments, the output signals from the Q output terminal and the Q-bar output terminal may be determined according to the follow latch truth table:

TABLE 1

| EXAMPLE LATCH TRUTH TABLE | | | |
|---|---|---|---|
| Input Signal To The Set Input Terminal | Input Signal To The Reset Input Terminal | Output Signal From The Q Output Terminal | Output Signal From Q-Bar Output Terminal |
| 0 | 0 | No Change | No Change |
| 0 | 1 | 0 | 1 |
| 1 | 0 | 1 | 0 |
| 1 | 1 | Unidentified | Unidentified |

For example, when the first switch 402 and the fourth switch 408 are in the closed state and the second switch 404 and the third switch 406 are in the open state, the first capacitor 410 charges and the second capacitor 412 discharges. As such, the voltage across the first capacitor 410 increases (which causes the voltage $V_1$ at the first comparator non-inverting input terminal 414A to increase) and the voltage across the second capacitor 412 decreases (which causes the voltage $V_2$ at the second comparator non-inverting input terminal 414B to decrease). In some embodiments, the discharge of the second capacitor 412 causes the voltage $V_2$ at the second comparator non-inverting input terminal 414B to decrease to zero, and the second comparator 422B generates and provides an output signal indicating a low state ("0") through the second comparator output terminal 418B to the set input terminal of the latch 420. In some embodiments, when the voltage $V_1$ is increased to more than the reference voltage $V_{REF}$, the first comparator 422A generates and provides an output signal indicating a high state ("1") through the first comparator output terminal 418A to the reset input terminal of the latch 420. Based on the above example latch truth table, the Q output terminal of the latch 420 provides an output signal indicating a low state ("0") while the Q-bar output terminal of the latch 420 provides an output signal indicating a high state ("1"), which indicates a reset state of the latch 420.

In some embodiments, the first switch 402, the second switch 404, the third switch 406, and the fourth switch 408 comprise voltage-controlled switches that receive voltage signals for controlling the operational state of the switch. Examples of voltage-controlled switches include, but not limited to, P-channel Metal-Oxide-Semiconductor Field-Effect Transistor (PMOSFET) switches, N-channel Metal-Oxide-Semiconductor Field-Effect Transistor (NMOSFET) switches, Complementary Metal-Oxide-Semiconductor (CMOS) switches and/or the like.

In some embodiments, the output signals from the Q output terminal of the latch 420 are provided to the first switch 402 and the fourth switch 408 for controlling the operational states of the first switch 402 and the fourth switch 408, and the Q-bar output terminal of the latch 420 are provided to the second switch 404 and the third switch 406 for controlling the operational states of the second switch 404 and the third switch 406. In such embodiments, when the output signal indicates a low state ("0"), an example switch is switched to an open state (for example, switched off). In some embodiments, when the output signal indicates a high state ("1"), an example switch is switched to a closed state (for example, switched on).

Continuing from the above example, the voltage $V_1$ being increased to more than the reference voltage $V_{REF}$ trigger the Q output terminal of the latch 420 provides an output signal indicating a low state ("0") while the Q-bar output terminal of the latch 420 provides an output signal indicating a high state ("1"). As such, the first switch 402 and the fourth switch 408 are switched to an open state, while the second switch 404 and the third switch 406 are switched to a closed state. As such, the voltage across the first capacitor 410 decreases (which causes the voltage $V_1$ at the first comparator non-inverting input terminal 414A to decrease) and the voltage across the second capacitor 412 increases (which causes the voltage $V_2$ at the second comparator non-inverting input terminal 414B to increase). In some embodiments, the discharge of the first capacitor 410 causes the voltage $V_1$ at the first comparator non-inverting input terminal 414A to decrease to zero, and the first comparator 422A generates and provides an output signal indicating a low state ("0") through the first comparator output terminal 418A to the reset input terminal of the latch 420. In some embodiments, when the voltage $V_2$ is increased to more than the reference voltage $V_{REF}$, the second comparator 422B generates and provides an output signal indicating a high state ("1") through the second comparator output terminal 418B to the set input terminal of the latch 420. Based on the above example latch truth table, the Q output terminal of the latch 420 provides an output signal indicating a high state ("1") while the Q-bar output terminal of the latch 420 provides an output signal indicating a low state ("0"), which indicates a set state of the latch 420.

Continuing from the above example, the voltage $V_2$ being increased to more than the reference voltage $V_{REF}$ trigger the Q output terminal of the latch 420 provides an output signal indicating a high state ("1") while the Q-bar output terminal of the latch 420 provides an output signal indicating a low state ("0"). As such, the first switch 402 and the fourth switch 408 are switched to a closed state, while the second switch 404 and the third switch 406 are switched to an open state. Similar to those described above, the voltage across the first capacitor 410 increases until the voltage $V_1$ at the first comparator non-inverting input terminal 414A exceeds the reference voltage $V_{REF}$ and causes the operational states of the switches to change again.

As illustrated in the examples above, the first capacitor 410 and the second capacitor 412 may oscillate between charging and discharging. For example, when the voltage of the first capacitor 410 is charged to $V_{REF}$, the output signal from the Q-bar output terminal indicates a high state ("1") while the output signal from the Q output terminal indicates a low state ("0"), which in turn causes the first capacitor 410 to discharge and the second capacitor 412 to be charged. When the voltage of the second capacitor 412 is charged to the reference voltage $V_{REF}$, the output signal from the Q-bar output terminal indicates a low state ("0") while the output signal from the Q output terminal indicates a high state ("1"), which in turn causes the second capacitor 412 to discharge and the first capacitor 410 to be charged.

In some embodiments, the capacitance of the first capacitor 410 and the capacitance of the second capacitor 412 are the same. As such, the time period for charging the first capacitor 410 from zero to the reference voltage $V_{REF}$ is the same as the time period for charging the second capacitor 412 from zero to the reference voltage $V_{REF}$. In some embodiments, the time period for charging the first capacitor 410 (or the second capacitor 412) to reach the reference voltage $V_{REF}$ may be calculated based on the example equation:

$$T = \frac{C \times V_{REF}}{I}$$

In the above example equation, C refers to the capacitance of the first capacitor 410 (or the capacitance of the second capacitor 412), $V_{REF}$ refers to the reference voltage, and I refers to the input current.

As described above in connect with at least FIG. 3, the input current I may be provided by a current generator to the example RC relaxation oscillator based on applying the reference voltage $V_{REF}$ through a resistor with a resistance value R. In such examples, the above example equation may be rewritten as the following example equation:

$$T = \frac{C \times V_{REF}}{I} = \frac{C \times V_{REF}}{\frac{V_{REF}}{R}} = RC$$

As illustrated in the above example equation, the time period T for charging the first capacitor 410 (or the second capacitor 412) from zero to the reference voltage $V_{REF}$ corresponds to the RC component value of the example RC relaxation oscillator 400.

In some embodiments, the RC component value of the example RC relaxation oscillator is the same as or proportional to the RC component value of an RC circuit (for example, an integrator circuit) that is separated from or external to the example RC relaxation oscillator 400. In such example, the resistance value of the resistor in the RC circuit may be the same as or proportional to the resistance value of the resistor R in the current generator 300 described above in connection with at least FIG. 3, and the capacitance value of the capacitor in the RC circuit may be the same as or proportional to the capacitance value of the first capacitor 410 (or the second capacitor 412) in the example RC relaxation oscillator 400 described in connection with FIG. 4.

As an example, the resistor R in the current generator 300 described above in connection with at least FIG. 3 may be implemented using the same resistor product as that of the resistor in the RC circuit, and the first capacitor 410 (and the second capacitor 412) in the example RC relaxation oscillator 400 described in connection with FIG. 4 may be implemented using the same capacitor product as that of the capacitor of the RC circuit. As such, the resistor and the capacitor associated with the example RC relaxation oscillator 400 may have the same PVT variations as those of the RC circuit. In some embodiments, the example RC relaxation oscillator 400 is implemented in the same operation environment as that of the RC circuit. As such, the RC component value associated with the RC circuit may be the same as or proportional to the RC component value associated with the example RC relaxation oscillator 400, and the time period T for charging the first capacitor 410 (or the second capacitor 412) in the example RC relaxation oscillator 400 from zero to the reference voltage $V_{REF}$ corresponds to the RC component value of an example RC circuit that is separated from the example RC relaxation oscillator 400.

In some embodiments, the output signals from the Q output terminal of the latch 420 (or from the Q-bar output terminal of the latch 420) may also oscillate between a low state ("0") and a high state ("1") as the first capacitor 410 and the second capacitor 412 oscillates between charging and discharging. As illustrated in the examples above, the time period that the output signal from the Q-bar output terminal indicates a high state ("1") while the output signal from the Q output terminal indicates a low state ("0") may be the same as the time period T for charging the first capacitor 410 from zero to the reference voltage $V_{REF}$. The time period that the output signal from the Q-bar output terminal indicates a low state ("0") while the output signal from the Q output terminal indicates a high state ("1") may be the same as the time period T for charging the second capacitor 412 from zero to the reference voltage $V_{REF}$.

In some embodiments, the output signal from the Q-bar output terminal (or from the Q output terminal) may be referred to as an "oscillation signal." In such embodiments, the "oscillation period" of the oscillation signal refers to the time period that it takes for the oscillation signal from the Q output terminal of the latch 420 to complete one full cycle (or the time period that it takes for the oscillation signal from the Q-bar output terminal of the latch 420 to complete one full cycle). In some embodiments, the oscillation signal may be in a waveform. In such an example, the oscillating period of the example RC relaxation oscillator 400 is the duration between two consecutive occurrences of the same point in the waveform (such as two consecutive rising or falling edges).

In some embodiments, the oscillation period is based on the RC component value of the RC circuit. As described above, the time period that the oscillation signal from the Q-bar output terminal indicates a high state ("1") corresponds to the time period T for charging the first capacitor 410 from zero to the reference voltage $V_{REF}$, and the time period that the oscillation signal from the Q-bar output terminal indicates a low state ("0") corresponds to the time period T for charging the second capacitor 412 from zero to the reference voltage $V_{REF}$. In some embodiments, the time period T for charging the first capacitor 410 from zero to the reference voltage $V_{REF}$ is the same as the time period T for charging the second capacitor 412 from zero to the reference voltage $V_{REF}$. In some embodiments, a half of the oscillating period of the oscillation signal corresponds to the time period T for charging the first capacitor 410 (or the second capacitor 412) from zero to the reference voltage $V_{REF}$. Because the time period T for charging the first capacitor 410 (or the second capacitor 412) from zero to the reference voltage $V_{REF}$ corresponds to the RC component value of the RC circuit, the oscillation period of the oscillation signal is based on the RC component value of the RC circuit.

As such, various examples of the present disclosure essentially provide an oscillation clock, where the oscillation period of the oscillation clock is directly proportional to the product of the resistance value of the resistor and the capacitance value of the capacitor in an RC circuit (in other words, the RC component value of the RC circuit).

While the description above provides an example RC relaxation oscillator, it is noted that the scope of the present disclosure is not limited to the description above. In some examples, an example RC relaxation oscillator may comprise one or more additional and/or alternative electric components.

Figure 5:
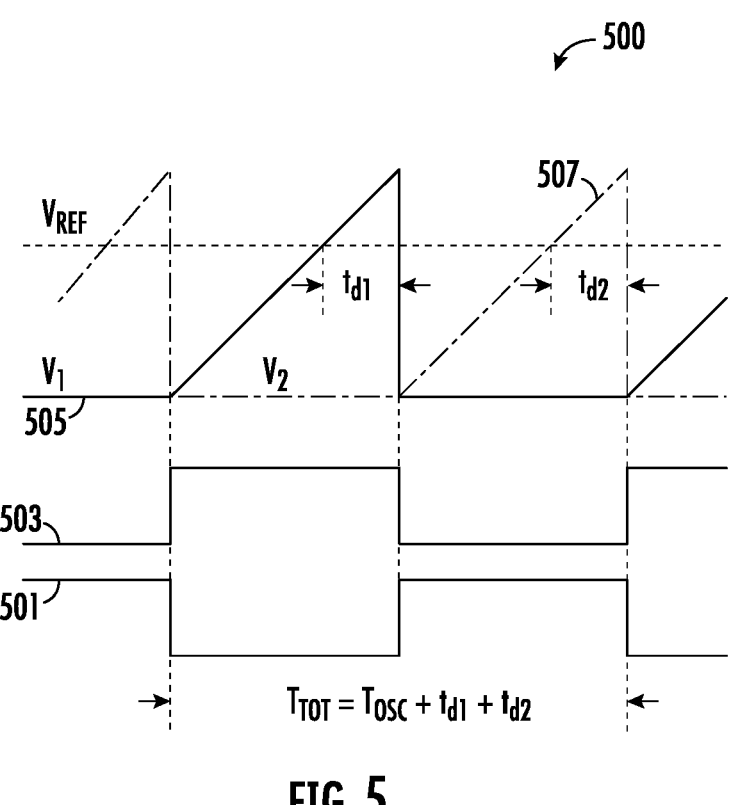
FIG. 5 illustrates an example signal diagram of the example RC relaxation oscillator in accordance with some embodiments of the present disclosure.

Referring now to FIG. 5, an example signal diagram 500 illustrates example electrical signals associated with an example RC relaxation oscillator in accordance with some embodiments of the present disclosure (such as, but not limited to, the example RC relaxation oscillator 400 illustrated above in connection with at least FIG. 4).

For example, the example signal diagram 500 illustrates example waveforms associated with the example electrical signals that include, but not limited to, waveform 501, waveform 503, waveform 505, and waveform 507. For example, the waveform 501 may illustrate the operational states of the first switch 402 and the fourth switch 408 described above in connection with FIG. 4. The waveform 503 may illustrate the operational states of the second switch 404 and the third switch 406 described above in connection with FIG. 4. As shown in FIG. 5, the first switch 402 and the fourth switch 408 are complementary to the second switch 404 and the third switch 406.

As another example, the waveform 505 may illustrate the voltage $V_1$ received at the first comparator non-inverting input terminal 414A of the first comparator 422A. The waveform 507 may illustrate the voltage $V_2$ received at the second comparator non-inverting input terminal 414B of the second comparator 422B. In particular, the example signal diagram 500 illustrates example time delays when an example RC relaxation oscillator is implemented in real-world applications (for example, time delay due to changing the operational state of the switches and/or comparing $V_1$ or $V_2$ with $V_{REF}$). In the example shown in FIG. 5, the time period Ta corresponds to the time delay between the time point when the first capacitor 410 is charged to the reference voltage $V_{REF}$ and the time point when the second capacitor 412 starts charging. The time period $T_{d2}$ corresponds to the time delay between the time point when the second capacitor 412 is charged to the reference voltage $V_{REF}$ and the time point when the first capacitor 410 starts charging.

In the example shown in FIG. 5, the time period $T_{OSC}$ refers to the oscillating period of an oscillation signal of the example RC relaxation oscillator, similar to various example described above. In some embodiments, the time period $T_{TOT}$ refers to a total time period of a complete waveform cycle (for example, a complete cycle of operational states associated with one of the switches). In the example shown in FIG. 5, the time period $T_{TOT}$ may be calculated based on combining the time period $T_{OSC}$ with the time period $T_{d1}$ and the time period $T_{d2}$ to account for delays.

In some embodiments, a ratio between the time period $T_{d1}$ and the time period $T_{TOT}$ may be the same as the ratio between the time period $T_{d2}$ and the time period $T_{TOT}$. In some embodiments, based on the time period $T_{TOT}$ and the ratio between the time period $T_{d1}$ (or the time period $T_{d2}$) and the time period $T_{TOT}$, the time period $T_{OSC}$ may be determined. As described above, the time period $T_{OSC}$ may indicate the RC component value of the RC circuit.

In some embodiments, the time period $T_{d1}$ and the time period $T_{d2}$ are negligible. In such embodiments, the time period $T_{TOT}$ may be the same as the time period $T_{OSC}$.

As illustrated in various examples above, the oscillation signal may provide information such as, but not limited to, the RC component value associated with an RC circuit. In some embodiments, a latch output terminal of the latch (for example, but not limited to, the Q output terminal or the Q-bar output terminal) may provide the oscillation signal to other circuits of the example RC calibration system (for example, but not limited to, an example RC deviation determination circuit of the example RC calibration system).

While the description above illustrates example waveforms associated with an example RC relaxation oscillator, it is noted that the scope of the present disclosure is not limited to the description above. In some examples, an example RC relaxation oscillator may generate one or more additional and/or alternative waveforms.

Figure 6:
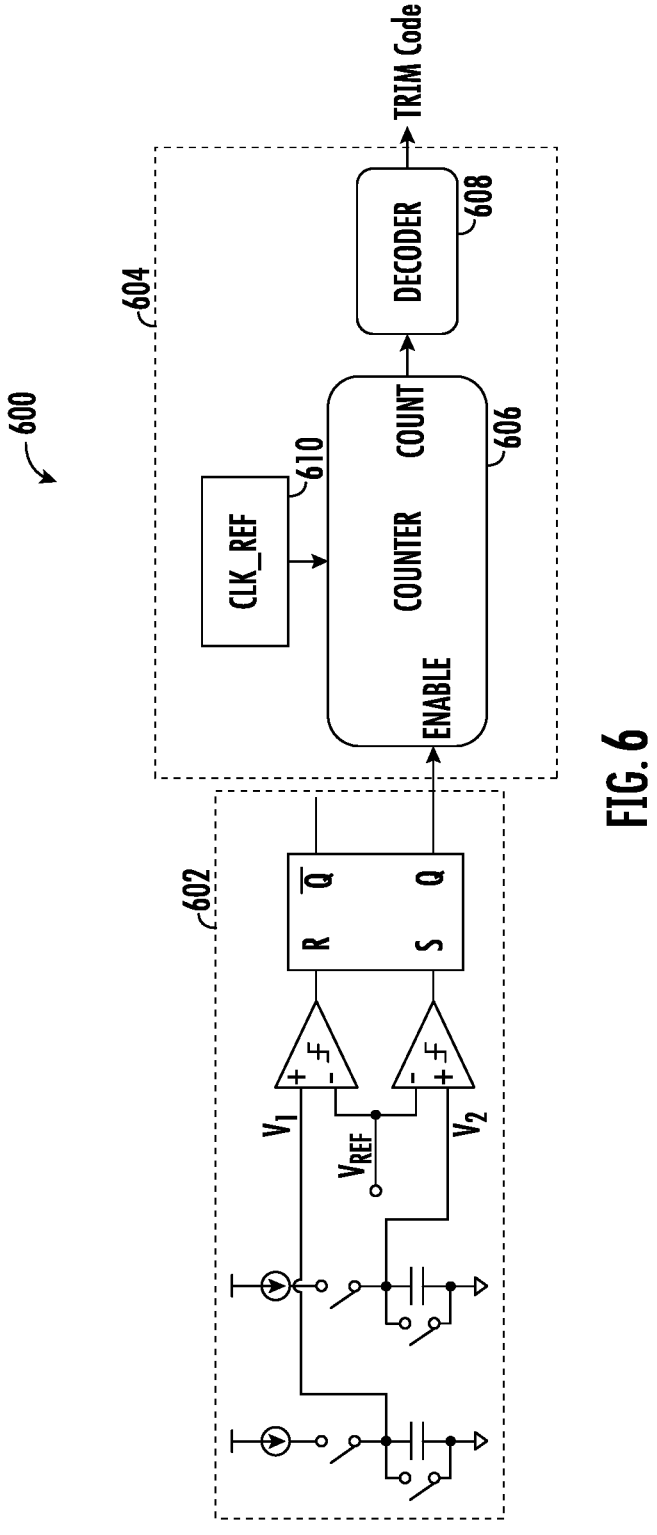
FIG. 6 illustrates example portions of an example RC calibration system for calibrating an example RC circuit in accordance with some embodiments of the present disclosure.

Referring now to FIG. 6, example portions of an example RC calibration system 600 for calibrating an RC circuit in accordance with some embodiments of the present disclosure are illustrated. In particular, FIG. 6 illustrates an example RC deviation determination circuit 604 that is coupled to an example RC relaxation oscillator 602.

In some embodiments, the RC deviation determination circuit 604 comprises a counter 606 and a decoder 608.

In some embodiments, an example counter refers to an electronic component that keeps track of system events such as, but not limited to, a number of clock cycles, a number of input pulses, or a number of occurrences of a specific condition within the system. In accordance with various examples of the present disclosure, an example counter may comprise asynchronous counters, synchronous counters, and/or the like.

In the example shown in FIG. 6, the counter 606 may receive the oscillation signal from the RC relaxation oscillator 602. For example, the counter 606 may receive the oscillation signal from the Q output terminal of the latch of the RC relaxation oscillator 602 as described above in connection with at least FIG. 4 and FIG. 5. Additionally, or alternatively, the counter 606 may receive the oscillation signal from the Q-bar output terminal of the latch of the RC relaxation oscillator 602 as described above in connection with at least FIG. 4 and FIG. 5.

In some embodiments, the counter 606 receives a reference clock signal from a reference clock 610. In some embodiments, an example reference clock refers to an electronic component that provides a reference clock signal that is stable and precise. In some embodiments, the reference clock signal may be used as a time base reference or a frequency reference for various other signals associated with a system. As such, the reference clock signal form the reference clock may provide a clean reference.

In the example shown in FIG. 6, the reference clock 610 may comprise a high frequency clock. For example, the frequency of the reference clock signal from a reference clock 610 may be higher than the oscillation frequency of the oscillation signal from the RC relaxation oscillator 602 (for example, but not limited to, one thousand times higher).

As an example, the reference clock 610 may generate a reference clock signal that provides a complete clock cycle every two nanosecond. In such an example, the reference clock signal from the reference clock 610 may indicate a high state ("1") for one nanosecond, followed by a low state ("0") for another nanosecond, followed by another high state ("1") for another nanosecond, and so on.

In some embodiments, the counter 606 generates a clock cycle count associated with the oscillation signal received from the RC relaxation oscillator 602 based at least in part on the reference clock signal from the reference clock 610. For example, the clock cycle count generated by the counter 606 may indicate a number of complete clock cycles of the reference clock signal from the reference clock 610 during one pulse width of the oscillation signal from the RC relaxation oscillator 602 (for example, during the time interval when the oscillation signal from the RC relaxation oscillator 602 indicates a high state).

In some embodiments, the pulse width of the oscillation signal refers to a duration of a signal pulse of the oscillation signal. For example, the pulse width of the oscillation signal may indicate a time interval between the start and the end of the oscillation signal indicating a high state ("1"). As described above, the time period that the oscillation signal indicates a high state ("1") may be the same as the time period $T$ for charging the first capacitor 410 from zero to the reference voltage $V_{REF}$, and the time period $T$ is the same as the RC component value of the RC circuit. As such, the RC component value may be determined based on the clock cycle count that counts the number of complete clock cycles of the reference clock signal from the reference clock 610 during a pulse width of the oscillation signal.

In some embodiments, the counter 606 provides the clock cycle count associated with the oscillation signal to the decoder 608. In some embodiments, the decoder 608 receives the clock cycle count from the counter 606 and outputs an RC adjustment signal (for example, but not limited to, one or more trim codes).

In some embodiments, an example decoder refers to an electronic component that translates an encoded input signal into an decoded output signal that may be applied to adjust one or more other component of a system (for example, but not limited to, a RC circuit). For example, the example decoder may generate one or more RC adjustment signal for adjusting the RC copoint value associated with a RC circuit. As an example, an example RC adjustment signal may be in the form of a trim code for fine-tuning the RC component value associated with the RC circuit. In accordance with various examples of the present disclosure, examples of decoders may comprise binary-weighted decoders, thermometer-code decoders, one-hot decoders, and/or the like.

In the example shown in FIG. 6, the decoder 608 generates the RC adjustment signal based at least in part on comparing the clock cycle count from the counter 606 with a predetermined clock cycle count.

In some embodiments, the predetermined clock cycle count is based on a calibrated RC component value of the RC circuit. For example, the calibrated RC component value refers to an RC component value when the RC circuit has been calibrated to remove any deviations caused by any factors such as, but not limited to, PVT variations. Additionally, or alternatively, the calibrated RC component value of the RC circuit corresponds to a predetermined RC component value of the RC circuit according to the manufacturing specification of the RC circuit.

As described above, the RC component value of the RC circuit may be the same as the RC component value of the example RC relaxation oscillator. In such embodiments, the predetermined clock cycle count may indicate a number of complete clock cycles of the reference clock signal from the reference clock 610 during a pulse width of an example oscillation signal from an example RC relaxation oscillator when the RC component value of the example RC relaxation oscillator corresponds to the calibrated RC component value of the RC circuit.

Continuing from the example above, the predetermined clock cycle count may indicate that, when an example RC circuit behaviors normally and/or has been calibrated, the counter 606 may generate a clock cycle count that indicates one thousand clock cycles from the reference clock 610 during one pulse width of the oscillation signal from the RC relaxation oscillator.

However, when the RC component value of the RC circuit drifts (for example, but not limited to, due to PVT variations), the counter 606 may generate a clock cycle count that is less than or more than the predetermined clock cycle count during one pulse width of the oscillation signal from the RC relaxation oscillator.

For example, if PVT variations cause the RC component value of the RC circuit to increase by 20%, the time period for charging the capacitor of the RC relaxation oscillator 602 may reflect an increase of 20%, which in turn causes the pulse width of the oscillation signal from the RC relaxation oscillator 602 to increase by 20%. Continuing in this example, because the pulse width of the oscillation signal from the RC relaxation oscillator 602 is increased by 20%, the counter 606 generates a clock cycle count with a 20% increase in the number of the complete clock cycles of the reference clock signal from the reference clock 610 during one pulse width of the oscillation signal from the RC relaxation oscillator 602 as compared to that of the predetermined clock cycle count. In this example, the decoder 608 may receive an encoded input signal from the counter 606 that comprises the increased clock cycle count, compare the increased clock cycle count with the predetermined clock cycle count, and determines that the RC component value of the RC circuit has increased by 20%. Continuing in this example, the decoder 608 may generate an decoded signal that comprises an RC adjustment signal (for example, but not limited to, a trim code) to cause the RC component value of the RC circuit to decrease by 20%.

As another example, if PVT variations cause the RC component value of the RC circuit to decrease by 20%, the time period for charging the capacitor of the RC relaxation oscillator 602 may reflect a decrease of 20%, which in turn causes the pulse width of the oscillation signal from the RC relaxation oscillator 602 to decrease by 20%. Continuing in this example, because the pulse width of the oscillation signal from the RC relaxation oscillator 602 is decreased by 20%, the counter 606 generates a clock cycle count that indicates a 20% decrease in the number of the complete clock cycles of the reference clock signal from the reference clock 610 during one pulse width of the oscillation signal from the RC relaxation oscillator 602 as compared to that of the predetermined clock cycle count. In this example, the decoder 608 may receive an encoded input signal from the counter 606 that comprises the decreased clock cycle count, compare the decreased clock cycle count with the predetermined clock cycle count, and determines that the RC component value of the RC circuit has decreased by 20%. Continuing in this example, the decoder 608 may generate an decoded signal that comprises an RC adjustment signal (for example, but not limited to, a trim code) to cause the RC component value of the RC circuit to increase by 20%.

As illustrated in the various examples above, the decoder 608 may determine how much the actual RC component value of the RC circuit deviates from the desired RC component value of the RC circuit, and various examples of the present disclosure may implement programmable resistors and/or programmable capacitors to modify the RC component value associated with the RC circuit based on the RC adjustment signals generated by the decoder 608.

While the description above illustrates example portions of an example RC calibration system, it is noted that the scope of the present disclosure is not limited to the description above. In some examples, an example RC calibration system may comprise one or more additional and/or alternative elements.

Figure 7:
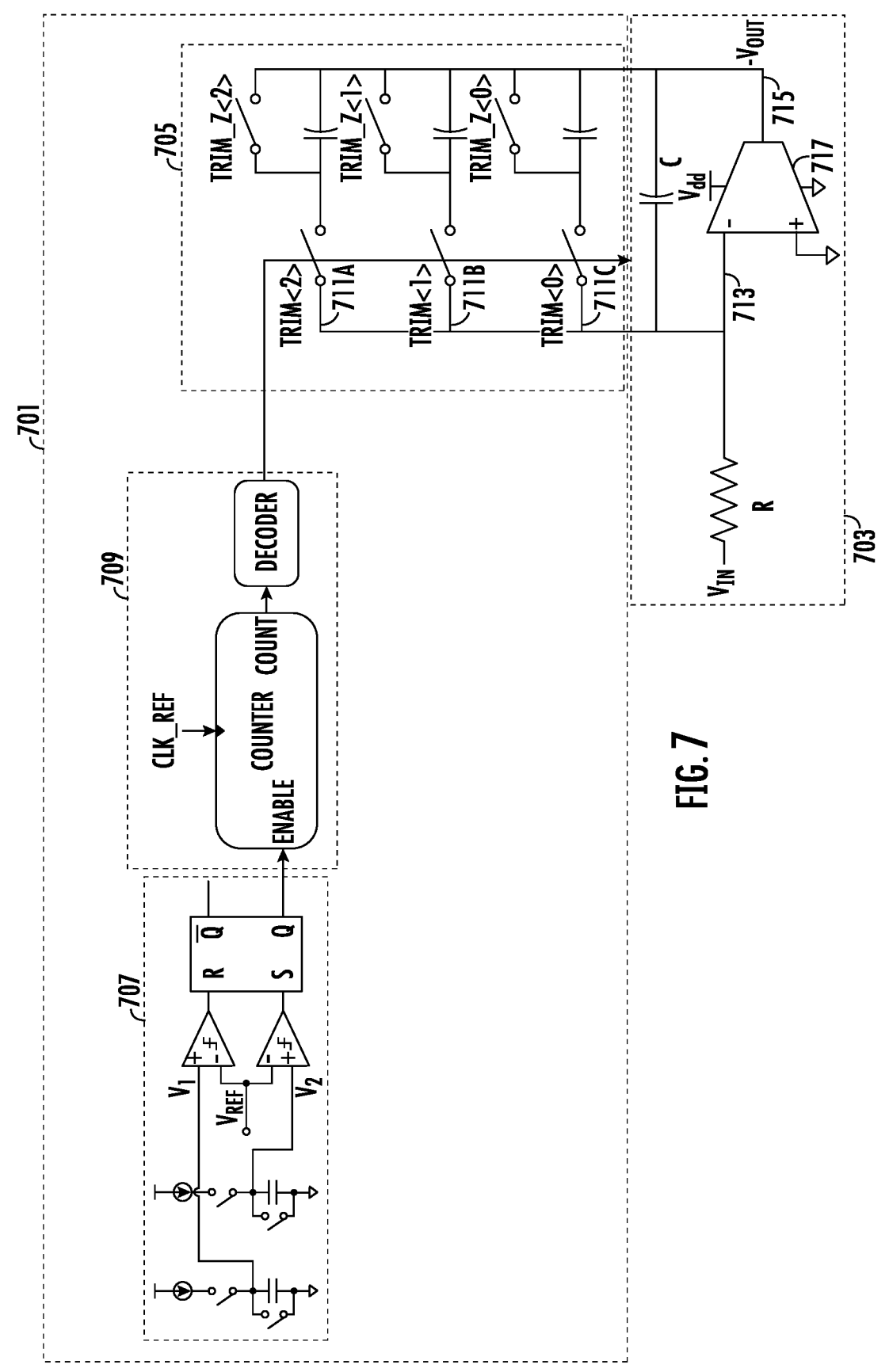
FIG. 7 illustrates an example RC circuit and an example RC calibration system for calibrating the example RC circuit in accordance with some embodiments of the present disclosure.

Referring now to FIG. 7, an example RC calibration system 701 that is coupled to an example RC circuit 703 in accordance with some embodiments of the present disclosure is illustrated. In the example shown in FIG. 7, the example RC calibration system 701 comprises an RC adjustment circuit 705, an RC relaxation oscillator 707, and an RC deviation determination circuit 709.

In some embodiments, the RC relaxation oscillator 707 is separated from the RC circuit 703. In some embodiments, the RC relaxation oscillator 707 generates an oscillation signal that indicates an RC component value associated with the RC circuit 703. For example, the resistance value of the resistor R in the RC circuit 703 may be the same as or proportional to the resistance value of the resistor in the example RC calibration system 701 (for example, the resistor in the current generator described above in connection with at least FIG. 3), and the capacitance value of the capacitor C in the RC circuit 703 may be the same as or proportional to the capacitance value of the capacitor from the example RC calibration system 701 (for example, the capacitor in the RC relaxation oscillator described above in connection with at least FIG. 4). As such, the RC component value associated with the RC circuit 703 may be the same as or proportional to the RC component value associated with the RC calibration system 701. In some embodiments, the example RC calibration system 701 is implemented in the same operation environment as the RC circuit 703. As such, any deviations or changes in the RC component value of the RC circuit 703 may be the same or be proportional to the deviations or changes in the RC component value associated with the RC calibration system 701. As such, the oscillation signal from the RC relaxation oscillator 707 may indicate an RC component value associated with the RC circuit 703.

In some embodiments, the RC deviation determination circuit 709 is coupled to the RC relaxation oscillator 707 and the RC adjustment circuit 705. For example, the RC deviation determination circuit 709 may receive the oscillation signal from the RC relaxation oscillator 707, generate an RC adjustment signal for adjusting the RC component value associated with the RC circuit 703 based at least in part on the oscillation signal and a reference clock signal, and output the RC adjustment signal to the RC adjustment circuit 705, similar to various examples described above in connection with at least FIG. 6.

In some embodiments, the RC adjustment circuit 705 is coupled to the RC circuit 703. In the example shown in FIG. 7, the RC adjustment circuit 705 comprises a plurality of capacitance adjustment circuit branches (such as, but not limited to, the capacitance adjustment circuit branch 711A, the capacitance adjustment circuit branch 711B, and the capacitance adjustment circuit branch 711C). In some embodiments, the plurality of capacitance adjustment circuit branches (such as, but not limited to, the capacitance adjustment circuit branch 711A, the capacitance adjustment circuit branch 711B, and the capacitance adjustment circuit branch 711C) is coupled in parallel to one another and to the capacitor C of the RC circuit 703. For example, a first end of the capacitor C and a first end of each of plurality of capacitance adjustment circuit branches (such as, but not limited to, the capacitance adjustment circuit branch 711A, the capacitance adjustment circuit branch 711B, and the capacitance adjustment circuit branch 711C) are coupled to the amplifier inverting input terminal 713, and a second end of the capacitor C and a second end of each of plurality of capacitance adjustment circuit branches (such as, but not limited to, the capacitance adjustment circuit branch 711A, the capacitance adjustment circuit branch 711B, and the capacitance adjustment circuit branch 711C) are coupled to the amplifier output terminal 715 of the amplifier 717 of the RC circuit 703.

In some embodiments, the plurality of capacitance adjustment circuit branches (such as, but not limited to, the capacitance adjustment circuit branch 711A, the capacitance adjustment circuit branch 711B, and the capacitance adjustment circuit branch 711C) comprises a plurality of branch switches and a plurality of adjustment capacitors. For example, each of the plurality of adjustment capacitors may be coupled to a corresponding branch switch of the plurality of branch switches in a corresponding capacitance adjustment circuit branch (such as, but not limited to, the capacitance adjustment circuit branch 711A, the capacitance adjustment circuit branch 711B, and the capacitance adjustment circuit branch 711C).

As described above, the RC deviation determination circuit 709 (for example, the decoder of the RC deviation determination circuit 709) may output RC adjustment signals to the RC adjustment circuit 705. In some embodiments, the operational states of the plurality of branch switches may be controlled based on the RC adjustment signal. In such an example, the RC deviation determination circuit 709 outputs the RC adjustment signal to the plurality of branch switches of the RC adjustment circuit 705, and the plurality of branch switches of the RC adjustment circuit 705 may adjust the operational states based on the RC adjustment signal. In some embodiments, the plurality of branch switches may comprise one or more voltage-controlled switches such as, but not limited to, NMOSFET switches, PMOSFET switches, CMOS switches, and/or the like.

For example, the RC adjustment signal may indicate that the RC component value of the RC circuit 703 needs to be increased by 20% to accommodate for deviations of the RC component value due to factors such as, but not limited to, PVT variations. In such an example, the RC deviation determination circuit 709 may output an RC adjustment signal to each of the plurality of branch switches of the RC adjustment circuit 705 to adjust the operational states of the plurality of branch switches by opening and/or closing one or more branch switches so that the capacitance of the RC circuit 703 is increased by 20%. For example, the RC deviation determination circuit 709 may output an RC adjustment signal to the branch switch of the capacitance adjustment circuit branch 711A so that the branch switch is switched on, output an RC adjustment signal to the branch switch of the capacitance adjustment circuit branch 711B so that the branch switch is switched off, and output an RC adjustment signal to the branch switch of the capacitance adjustment circuit branch 711C so that the branch switch is switched off. In this example, the capacitance of the RC circuit 703 is increased because the capacitance adjustment circuit branch 711A is switched on. As such, FIG. 7 illustrates an example implementation of providing capacitance control to the RC circuit 703 to calibrate the RC component value.

While the description above illustrates example portions of an example RC calibration system, it is noted that the scope of the present disclosure is not limited to the description above. In some examples, an example RC calibration system may comprise one or more additional and/or alternative elements.

Figure 8:
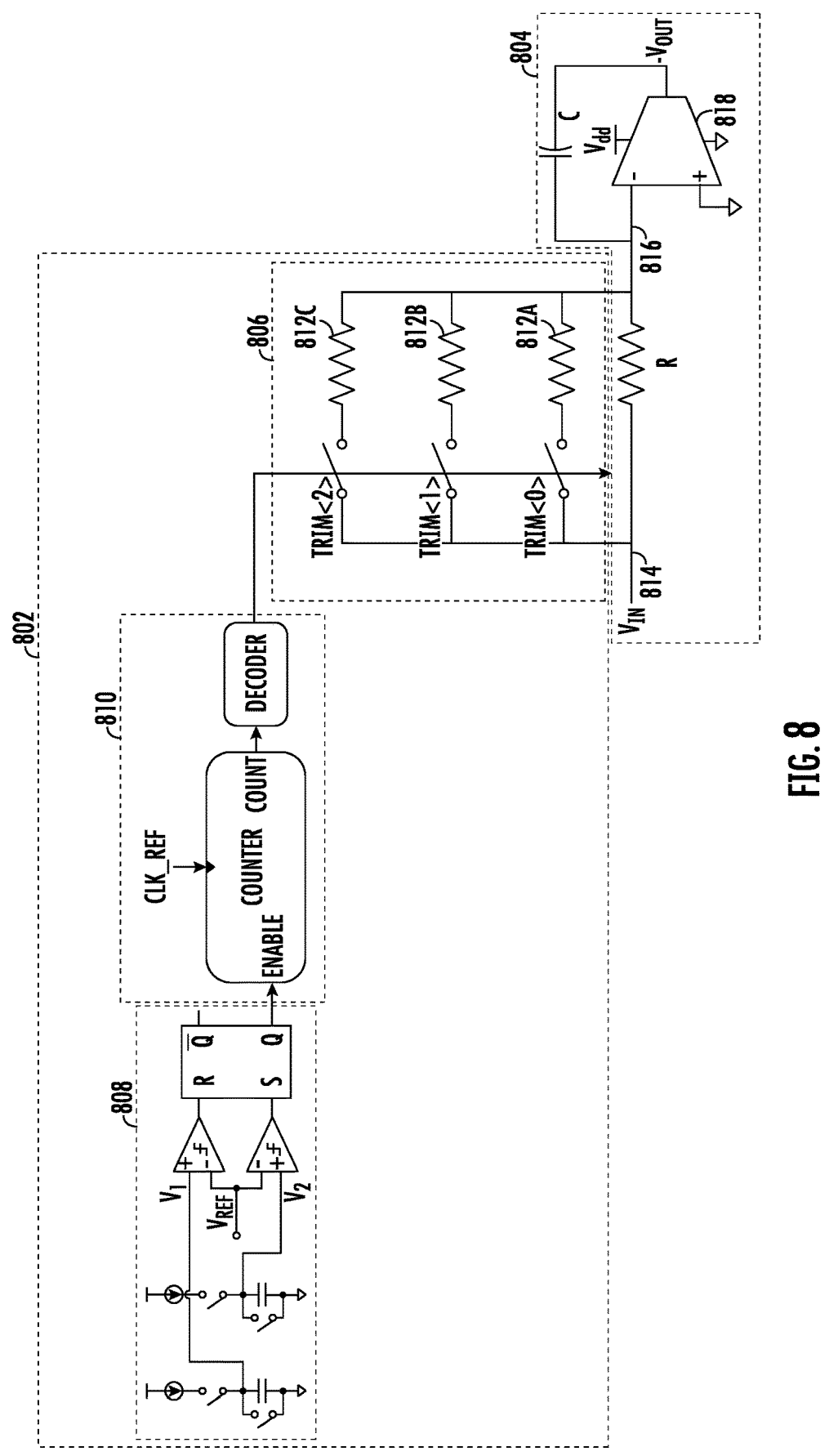
FIG. 8 illustrates an example RC circuit and an example RC calibration system for calibrating the example RC circuit in accordance with some embodiments of the present disclosure.

Referring now to FIG. 8, an example RC calibration system 802 that is coupled to an example RC circuit 804 in accordance with some embodiments of the present disclosure is illustrated. In the example shown in FIG. 8, the example RC calibration system 802 comprises an RC adjustment circuit 806, an RC relaxation oscillator 808, and an RC deviation determination circuit 810.

In some embodiments, the RC relaxation oscillator 808 is separated from the RC circuit 804. In some embodiments, the RC relaxation oscillator 808 generates an oscillation signal that indicates an RC component value associated with the RC circuit 804. For example, the resistance value of the resistor R in the RC circuit 804 may be the same as or proportional to the resistance value of the resistor in the example RC calibration system 802 (for example, the resistor in the current generator described above in connection with at least FIG. 3), and the resistance value of the capacitor C in the RC circuit 804 may be the same as or proportional to the resistance value of the capacitor from the example RC calibration system 802 (for example, the capacitor in the RC relaxation oscillator described above in connection with at least FIG. 4). As such, the RC component value associated with the RC circuit 804 may be the same as or proportional to the RC component value associated with the RC calibration system 802. In some embodiments, the example RC calibration system 802 is implemented in the same operation environment as the RC circuit 804. As such, any deviations or changes in the RC component value of the RC circuit 804 may be the same or be proportional to the deviations or changes in the RC component value associated with the RC calibration system 802. As such, the oscillation signal from the RC relaxation oscillator 808 may indicate an RC component value associated with the RC circuit 804.

In some embodiments, the RC deviation determination circuit 810 is coupled to the RC relaxation oscillator 808 and the RC adjustment circuit 806. For example, the RC deviation determination circuit 810 may receive the oscillation signal from the RC relaxation oscillator 808, generate an RC adjustment signal for adjusting the RC component value associated with the RC circuit 804 based at least in part on the oscillation signal and a reference clock signal, and output the RC adjustment signal to the RC adjustment circuit 806, similar to various examples described above in connection with at least FIG. 6.

In some embodiments, the RC adjustment circuit 806 is coupled to the RC circuit 804. In the example shown in FIG. 8, the RC adjustment circuit 806 comprises a plurality of resistance adjustment circuit branches (such as, but not limited to, the resistance adjustment circuit branch 812A, the resistance adjustment circuit branch 812B, and the resistance adjustment circuit branch 812C). In some embodiments, the plurality of resistance adjustment circuit branches (such as, but not limited to, the resistance adjustment circuit branch 812A, the resistance adjustment circuit branch 812B, and the resistance adjustment circuit branch 812C) is coupled in parallel to one another and to the resistor R of the RC circuit 804. For example, a first end of the resistor R and a first end of each of plurality of resistance adjustment circuit branches (such as, but not limited to, the resistance adjustment circuit branch 812A, the resistance adjustment circuit branch 812B, and the resistance adjustment circuit branch 812C) are coupled to the input voltage source 814, and a second end of the resistor R and a second end of each of plurality of resistance adjustment circuit branches (such as, but not limited to, the resistance adjustment circuit branch 812A, the resistance adjustment circuit branch 812B, and the resistance adjustment circuit branch 812C) are coupled to the amplifier inverting input terminal 816 of the amplifier 818 of the RC circuit 804.

In some embodiments, the plurality of resistance adjustment circuit branches (such as, but not limited to, the resistance adjustment circuit branch 812A, the resistance adjustment circuit branch 812B, and the resistance adjustment circuit branch 812C) comprises a plurality of branch switches and a plurality of adjustment resistors. For example, each of the plurality of adjustment resistors may be coupled to a corresponding branch switch of the plurality of branch switches in a corresponding resistance adjustment circuit branch (such as, but not limited to, the resistance adjustment circuit branch 812A, the resistance adjustment circuit branch 812B, and the resistance adjustment circuit branch 812C).

As described above, the RC deviation determination circuit 810 (for example, the decoder of the RC deviation determination circuit 810) may output RC adjustment signals to the RC adjustment circuit 806. In some embodiments, the operational states of the plurality of branch switches may be controlled based on the RC adjustment signal. In such an example, the RC deviation determination circuit 810 outputs the RC adjustment signal to the plurality of branch switches of the RC adjustment circuit 806, and the plurality of branch switches of the RC adjustment circuit 806 may adjust the operational states based on the RC adjustment signal. In some embodiments, the plurality of branch switches may comprise one or more voltage-controlled switches such as, but not limited to, NMOSFET switches, PMOSFET switches, CMOS switches, and/or the like.

For example, the RC adjustment signal may indicate that the RC component value of the RC circuit 804 needs to be reduced by 20% to accommodate for deviations of the RC component value due to factors such as, but not limited to, PVT variations. In such an example, the RC deviation determination circuit 810 may output an RC adjustment signal to each of the plurality of branch switches of the RC adjustment circuit 806 to adjust the operational states of the plurality of branch switches by opening and/or closing one or more branch switches so that the resistance of the RC circuit 804 is reduced by 20%. For example, the RC deviation determination circuit 810 may output an RC adjustment signal to the branch switch of the resistance adjustment circuit branch 812A so that the branch switch is switched on, output an RC adjustment signal to the branch switch of the resistance adjustment circuit branch 812B so that the branch switch is switched off, and output an RC adjustment signal to the branch switch of the resistance adjustment circuit branch 812C so that the branch switch is switched off. In this example, the resistance of the RC circuit 804 is decreased because the resistance adjustment circuit branch 812A is switched on. As such, FIG. 8 illustrates an example implementation of providing resistance control to the RC circuit 804 to calibrate the RC component value.

While the description above illustrates example portions of an example RC calibration system, it is noted that the scope of the present disclosure is not limited to the description above. In some examples, an example RC calibration system may comprise one or more additional and/or alternative elements.

Referring now to FIG. 9, an example flow diagram illustrating an example method 900 for calibrating an example RC circuit in accordance with some embodiments of the present disclosure is illustrated. In some embodiments, the example method 900 may be implemented by an example RC calibration system described herein, including, but not limited to, the example RC calibration system 701 described above in connection with FIG. 7 and/or the example RC calibration system 802 described above in connection with FIG. 8.

In the example shown in FIG. 9, the example method 900 starts at step/operation 901. In some embodiments, subsequent to step/operation 901, the example method 900 proceeds to step/operation 903. At step/operation 903, the example method 900 includes receiving an oscillation signal from an RC relaxation oscillator.

In some embodiments, the oscillation signal from an RC relaxation oscillator indicates an RC component value associated with a RC circuit, similar to various examples described above. In some embodiments, the RC relaxation oscillator is separated from the RC circuit, similar to various examples described above.

In some embodiments, the oscillation signal may be associated with an oscillation period of the RC relaxation oscillator. In some embodiments, the oscillation period refers to the time period that it takes for the oscillation signal from the RC relaxation oscillator to complete one full cycle, similar to various examples described above. In some embodiments, the oscillation period may be based on the RC component value of the RC circuit. For example, the RC component value may correspond to a half of the oscillation period of the RC relaxation oscillator, similar to various examples described above. In some embodiments, the pulse width associated with the oscillation signal may correspond to the RC component value associated with the RC circuit, similar to various examples described above.

In some embodiments, subsequent to step/operation 903, the example method 900 proceeds to step/operation 905. At step/operation 905, the example method 900 includes generating a clock cycle count associated with the oscillation signal that is received at step/operation 903 based at least in part on a reference clock signal.

In some embodiments, an example RC calibration system may generate a clock cycle count associated with the oscillation signal received from the RC relaxation oscillator based at least in part on the reference clock signal from a reference clock. For example, the example RC calibration system may count the number of complete clock cycles of the reference clock signal from the reference clock during a pulse width of the oscillation signal (for example, during the time interval when the oscillation signal indicates a high state).

In some embodiments, subsequent to step/operation 905, the example method 900 proceeds to step/operation 907. At step/operation 907, the example method 900 includes determining whether the clock cycle count satisfies a predetermined clock cycle count.

Similar to those described above, the predetermined clock cycle count may be associated with a calibrated RC component value of the RC circuit. In some embodiments, by comparing the clock cycle count with the predetermined clock cycle count, various embodiments of the present disclosure may determine how much the RC component value has deviated from the desired RC component value.

If, at step/operation 907, the example method 900 determines that the clock cycle count satisfies the predetermined oscillation frequency count, the example method 900 proceeds to step/operation 913 and ends. In such an example, the RC calibration system determines that there is no deviation of the RC component value from the desired RC component value, and therefore there is no need to adjust the RC component value of the RC circuit.

If, at step/operation 907, the example method 900 determines that the clock cycle count does not satisfy the predetermined oscillation frequency count, the example method 900 proceeds to step/operation 909. At step/operation 909, the example method 900 includes determining an RC adjustment signal.

In some embodiments, the RC calibration system determines the RC adjustment signal for adjusting the RC component value associated with the RC circuit based at least in part on the oscillation signal received at step/operation 903 and the reference clock signal associated with step/operation 905. For example, the RC calibration system may generate the clock cycle count associated with the oscillation signal based at least in part on the reference clock signal at step/operation 905, and may generate the adjustment signal based on determining a difference between the clock cycle count and a predetermined clock cycle count.

For example, if the clock cycle count per pulse width of the oscillation signal has increased by 20% compared to the predetermined clock cycle count, the RC calibration system determines that the RC component value of the RC circuit has also increased by 20%. In such an example, the RC calibration system generates RC adjustment signals (for example, but not limited to, trim codes) to decrease the RC component value by 20%.

As another example, if the clock cycle count per pulse width of the oscillation signal has decreased by 20% compared to the predetermined clock cycle count, the RC calibration system determines that the RC component value of the RC circuit has also decreased by 20%. In such an example, the RC calibration system generates RC adjustment signals (for example, but not limited to, trim codes) to increase the RC component value by 20%.

In some embodiments, subsequent to step/operation 909, the example method 900 proceeds to step/operation 911. At step/operation 911, the example method 900 includes transmitting one or more RC adjustment signals to an RC adjustment circuit.

In some embodiments, the RC adjustment circuit is coupled to the RC circuit and comprises one or more adjustment circuit branches. In some embodiments, each of the one or more adjustment circuit branches comprises at least one branch switch that is controlled by the one or more RC adjustment signals.

For example, the RC adjustment circuit may comprise one or more capacitance adjustment circuit branches. In such an example, each of the one or more capacitance adjustment circuit branches comprises at least one branch switch coupled to at least one adjustment capacitor. In some embodiments, the at least one branch switch may comprise a voltage-controlled switch such that the operational state of the at least one branch switch is controlled by the one or more RC adjustment signals. For example, the RC adjustment signal may cause one or more branch switches of the one or more capacitance adjustment circuit branches to be turned on or turned off to increase the RC component value of the RC circuit by 20%, similar to various examples described above.

As another example, the RC adjustment circuit may comprise one or more resistance adjustment circuit branches. In such an example, each of the one or more resistance adjustment circuit branches comprises at least one branch switch coupled to at least one adjustment resistor. In some embodiments, the at least one branch switch may comprise a voltage-controlled switch such that the operational state of the at least one branch switch is controlled by the one or more RC adjustment signals. For example, the RC adjustment signal may cause one or more branch switches of the one or more resistance adjustment circuit branches to be turned on or turned off to decrease the RC component value of the RC circuit by 20%, similar to various examples described above.

In some embodiments, the RC circuit comprises an integrator circuit associated with a Delta-Sigma modulator. In such an example, the example RC calibration system calibrates the RC component value associated with the integrator circuit so that the Delta-Sigma modulator is stable, providing technical benefits and advantages such as, but not limited to, improved performance of the Delta-Sigma modulator.

In some embodiments, subsequent to step/operation 911, the example method 900 proceeds to step/operation 913 and ends.

Referring now to FIG. 10, an example block diagram illustrating an example Delta-Sigma modulator 1000 in accordance with some embodiments of the present disclosure is illustrated. In some embodiments, the example Delta-Sigma modulator 1000 comprises an integrator circuit 1002 and an RC calibration system 1004.

In some embodiments, the integrator circuit 1002 receives one or more input signals and performs one or more integration operations on the one or more input signals. In some embodiments, the integrator circuit 1002 may comprise one or more resistors and capacitors. In some embodiments, the RC component value of the integrator circuit 1002 may deviate from a desired value due to factors such as, but not limited to, PVT variations.

In some embodiments, the RC calibration system 1004 is coupled to the integrator circuit 1002 and calibrates the RC component value of the integrator circuit 1002. In some embodiments, the RC calibration system 1004 comprises an RC adjustment circuit 1006, an RC relaxation oscillator 1008, and an RC relaxation oscillator 1008.

In some embodiments, the RC relaxation oscillator 1008 is separated from the integrator circuit 1002 and generates an oscillation signal that indicates an RC component value associated with the integrator circuit 1002, similar to the various examples described above.

In some embodiments, the RC deviation determination circuit 1010 is coupled to the RC relaxation oscillator 1008 and the RC adjustment circuit 1006. In some embodiments, the RC deviation determination circuit 1010 generates an RC adjustment signal for adjusting the RC component value associated with the integrator circuit 1002 based at least in part on the oscillation signal from the RC relaxation oscillator 1008 and a reference clock signal, similar to the various examples described above. For example, the RC deviation determination circuit 1010 may comprise a counter that generates a clock cycle count indicating the RC component value of the integrator circuit 1002, as well as a decoder that compares the clock cycle count with a predetermined clock cycle count to generate the RC adjustment signal, similar to the various examples described above.

In some embodiments, the RC adjustment circuit 1006 is coupled to the integrator circuit 1002 and the RC deviation determination circuit 1010. For example, the RC adjustment circuit 1006 may adjust the RC component value of the RC relaxation oscillator 1008 based on the RC adjustment signal from the RC deviation determination circuit 1010, similar to various examples described above. For example, the RC adjustment circuit 1006 may comprise one or more adjustment circuit branches that are controlled by the RC adjustment signal from the RC deviation determination circuit 1010, similar to the various examples described above.

While this detailed description has set forth some embodiments of the present invention, the appended claims also cover other embodiments of the present invention which may differ from the described embodiments according to various modifications and improvements. For example, in some embodiments, example RC circuits may include, but not limited to, low pass RC integrator circuit circuits, high pass RC integrator circuit circuits, band pass RC integrator circuit circuits, band reject RC integrator circuit circuits, and/or the like. In some embodiments, example RC calibration systems may be implemented for RC circuits in connection with other systems such as, but not limited to, differentiators, filters (including, but are not limited to low pass filters, high pass filters, bandpass filters, and/or the like), timing circuits, voltage regulators, and/or the like.

Within the appended claims, unless the specific term "means for" or "step for" is used within a given claim, it is not intended that the claim be interpreted under 35 U.S.C. 112, paragraph 6.

The invention claimed is:

1. A system for calibrating a resistor-capacitor (RC) circuit comprising:
    an RC adjustment circuit coupled to the RC circuit;
    an RC relaxation oscillator separated from the RC circuit and generating an oscillation signal that indicates an RC component value associated with the RC circuit; and
    an RC deviation determination circuit coupled to the RC relaxation oscillator and the RC adjustment circuit, wherein the RC deviation determination circuit generates an RC adjustment signal for adjusting the RC component value associated with the RC circuit based at least in part on the oscillation signal and a reference clock signal.

2. The system of claim 1, wherein the RC circuit comprises an integrator circuit associated with a Delta-Sigma modulator.

3. The system of claim 1, wherein the RC circuit comprises:
    an amplifier having an amplifier input terminal and an amplifier output terminal;
    a resistor coupled to an input voltage source and the amplifier input terminal; and
    a capacitor coupled to the amplifier input terminal and the amplifier output terminal.

4. The system of claim 1, wherein the oscillation signal is associated with an oscillation period, wherein the oscillation period is based on the RC component value.

5. The system of claim 1, wherein the RC deviation determination circuit comprises:
    a counter receiving the oscillation signal from the RC relaxation oscillator and the reference clock signal from a reference clock, wherein the counter generates a clock cycle count associated with the oscillation signal based at least in part on the reference clock signal.

6. The system of claim 5, wherein the RC deviation determination circuit comprises:
    a decoder receiving the clock cycle count from the counter and outputting the RC adjustment signal to the RC adjustment circuit, wherein the decoder generates the RC adjustment signal based at least in part on comparing the clock cycle count with a predetermined clock cycle count.

7. The system of claim 6, wherein the predetermined clock cycle count is based on a calibrated RC component value associated with the RC circuit.

8. A method for calibrating a resistor-capacitor (RC) circuit comprising:

receiving an oscillation signal from an RC relaxation oscillator that indicates an RC component value associated with the RC circuit, wherein the RC relaxation oscillator is separated from the RC circuit;

determining an RC adjustment signal for adjusting the RC component value associated with the RC circuit based at least in part on the oscillation signal and a reference clock signal; and transmitting the RC adjustment signal to an RC adjustment circuit that is coupled to the RC circuit.

9. The method of claim 8, wherein the RC circuit comprises an integrator circuit associated with a Delta-Sigma modulator.

10. The method of claim 8, wherein the RC circuit comprises:

an amplifier having an amplifier input terminal and an amplifier output terminal;

a resistor coupled to an input voltage source and the amplifier input terminal; and a capacitor coupled to the amplifier input terminal and the amplifier output terminal.

11. The method of claim 8, wherein the oscillation signal is associated with an oscillation period, wherein the oscillation period is based on the RC component value.

12. The method of claim 8 further comprising:

generating a clock cycle count associated with the oscillation signal based at least in part on the reference clock signal.

13. The method of claim 12 further comprising:

generating the RC adjustment signal based at least in part on comparing the clock cycle count with a predetermined clock cycle count.

14. The method of claim 13, wherein the predetermined clock cycle count is based on a calibrated RC component value associated with the RC circuit.

15. A Delta-Sigma modulator comprising:

an integrator circuit; and a resistor-capacitor (RC) calibration system coupled to the integrator circuit and comprising:

an RC adjustment circuit coupled to the integrator circuit;

an RC relaxation oscillator separated from the integrator circuit and generating an oscillation signal that indicates an RC component value associated with the integrator circuit; and an RC deviation determination circuit coupled to the RC relaxation oscillator and the RC adjustment circuit, wherein the RC deviation determination circuit generates an RC adjustment signal for adjusting the RC component value associated with the integrator circuit based at least in part on the oscillation signal and a reference clock signal.

16. The Delta-Sigma modulator of claim 15, wherein the integrator circuit is associated with a loop filter of the Delta-Sigma modulator.

17. The Delta-Sigma modulator of claim 15, wherein the integrator circuit comprises:

an amplifier having an amplifier input terminal and an amplifier output terminal;

a resistor coupled to an input voltage source and the amplifier input terminal; and a capacitor coupled to the amplifier input terminal and the amplifier output terminal.

18. The Delta-Sigma modulator of claim 15, wherein the oscillation signal is associated with an oscillation period, wherein the oscillation period is based on the RC component value.

19. The Delta-Sigma modulator of claim 15, wherein the RC deviation determination circuit comprises:

a counter receiving the oscillation signal from the RC relaxation oscillator and the reference clock signal from a reference clock, wherein the counter generates a clock cycle count associated with the oscillation signal based at least in part on the reference clock signal.

20. The Delta-Sigma modulator of claim 19, wherein the RC deviation determination circuit comprises:

a decoder receiving the clock cycle count from the counter and outputting the RC adjustment signal to the RC adjustment circuit, wherein the decoder generates the RC adjustment signal based at least in part on comparing the clock cycle count with a predetermined clock cycle count.

\* \* \* \* \*